(12) United States Patent
Aoki et al.

(10) Patent No.: US 7,838,877 B2
(45) Date of Patent: Nov. 23, 2010

(54) INFORMATION RECORDING AND REPRODUCING APPARATUS

(75) Inventors: Shinya Aoki, Kanagawa-ken (JP); Kohichi Kubo, Kanagawa-ken (JP); Takayuki Tsukamoto, Kanagawa-ken (JP); Chikayoshi Kamata, Kanagawa-ken (JP); Takahiro Hirai, Kanagawa-ken (JP); Toshiro Hiraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 258 days.

(21) Appl. No.: 12/057,982

(22) Filed: Mar. 28, 2008

(65) Prior Publication Data
US 2009/0034123 A1  Feb. 5, 2009

(30) Foreign Application Priority Data

Mar. 30, 2007 (JP) ............................. 2007-094629
Jun. 12, 2007 (JP) ............................. 2007-155703

(51) Int. Cl.
*H01L 29/12* (2006.01)
(52) U.S. Cl. ........... 257/43; 257/E33.064; 257/E33.126
(58) Field of Classification Search ................. 257/245, 257/298, 43, E33.064, E33.126; 438/261; 365/148, 151
See application file for complete search history.

(56) References Cited

U.S. PATENT DOCUMENTS 4,067,780 A * 1/1978 Fujiwara et al. ............... 205/53
2006/0097288 A1   5/2006 Baek et al.
2007/0133358 A1* 6/2007 Kubo et al. .............. 369/13.38
2007/0274193 A1  11/2007 Akiyama et al.
2008/0068743 A1   3/2008 Kubo et al.
2008/0231986 A1   9/2008 Aoki et al.
2008/0239797 A1  10/2008 Tsukamoto et al.
2008/0253269 A1  10/2008 Koga et al.

FOREIGN PATENT DOCUMENTS

| JP | 2005-317787 | 11/2005 |
| JP | 2006-80259 | 3/2006 |
| JP | 2006-140464 | 6/2006 |

OTHER PUBLICATIONS

U.S. Appl. No. 12/057,938, filed Mar. 28, 2008, Kamata et al.
S. Seo, et al., "Reproducible Resistance Switching in Polycrystalline NiO Films", Applied Physics Letters, vol. 85, No. 23, Dec. 6, 2004, pp. 5655-5657.
Zhang et al, American Mineralogist, (1994) vol. 79, pp. 168-174.

* cited by examiner

*Primary Examiner*—Quoc D Hoang
(74) *Attorney, Agent, or Firm*—Oblon, Spivak, McClelland, Maier & Neustadt, L.L.P.

(57) ABSTRACT

There is proposed a nonvolatile information recording and reproducing device with low power consumption and high thermal stability. The information recording and reproducing apparatus according to an aspect of the present invention includes a recording layer and a unit for recording information by applying a voltage to the recording layer to generate a state change in the recording layer. The recording layer being configured to include at least a first compound having a hollandite structure.

20 Claims, 21 Drawing Sheets

□ DATA AREA
▣ SERVO AREA

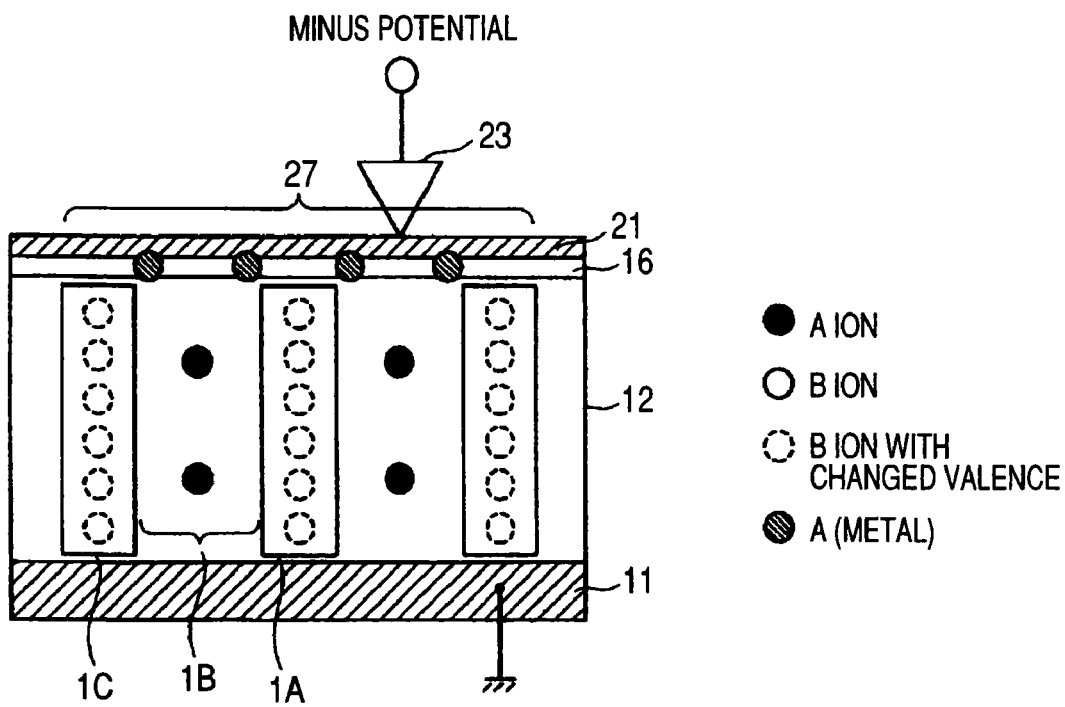
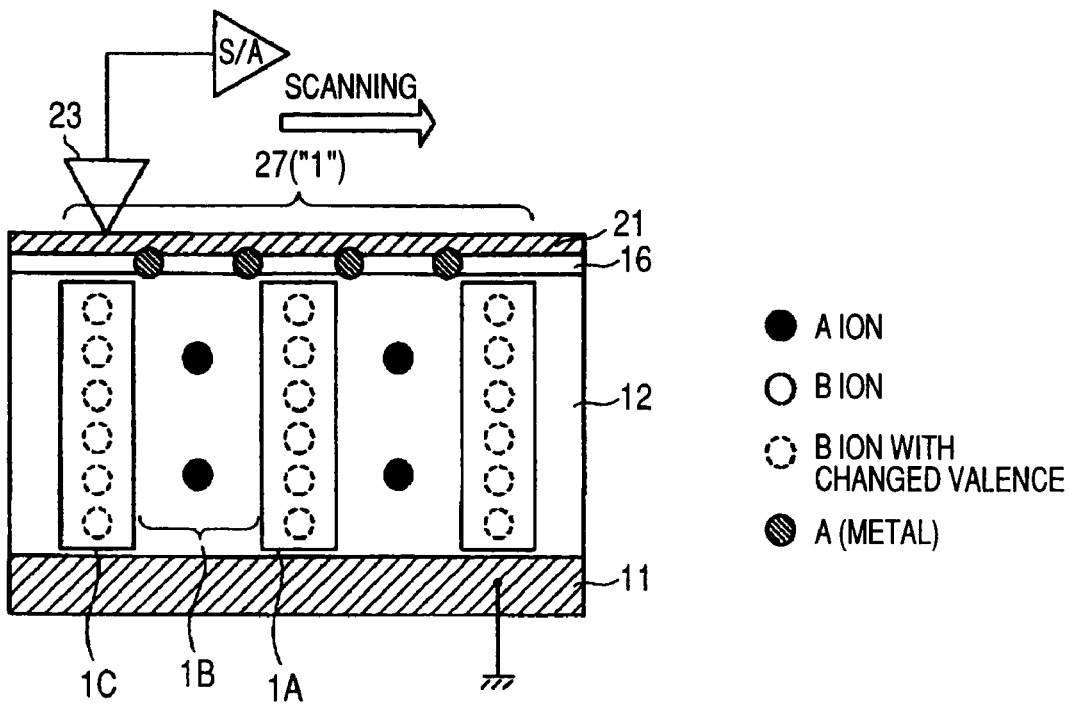

- ● A ION
- ○ B ION
- ◌ B ION WITH CHANGED VALENCE
- ◍ C ION
- ● D ION
- ◉ D ION WITH CHANGED VALENCE

- ● A ION
- ○ B ION
- ◌ B ION WITH CHANGED VALENCE
- ◍ C ION
- ● D ION
- ◉ D ION WITH CHANGED VALENCE

FIG. 17
SET (WRITING) OPERATION
HIGH RESISTANCE → LOW RESISTANCE
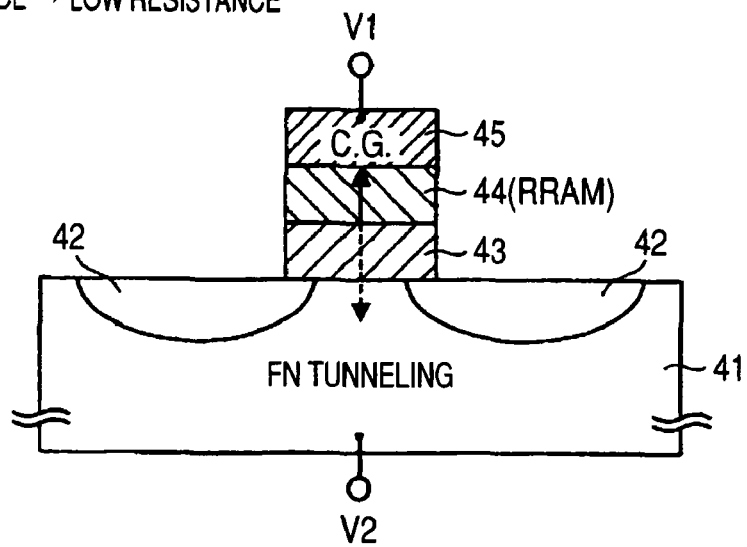
RESET OPERATION ⬆    ⬇ SET OPERATION
RESET (ERASING) OPERATION
LOW RESISTANCE → HIGH RESISTANCE
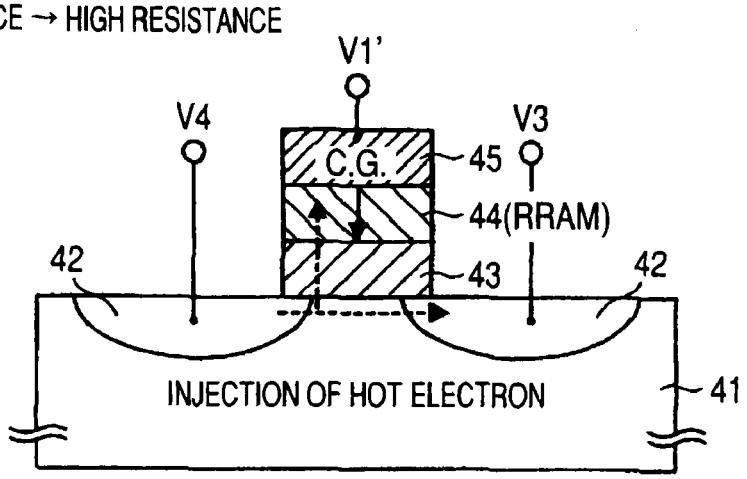
- - - - - ▶ MOVEMENT OF ELECTRON
———▶ MOVEMENT OF ION

INFORMATION RECORDING AND REPRODUCING APPARATUS

BACKGROUND OF THE INVENTION

1. Field of the Invention

The present invention relates to an information recording and reproducing apparatus with high recording density.

2. Description of the Related Art

In recent years, small-sized portable equipment has been diffused in the world. At the same time, following the great development of high-speed information transport network, demands of small-sized large-capacity nonvolatile memories have rapidly expanded. Above all, in NAND type flash memories and small-sized HDDs (hard disk drives), the recording density has rapidly developed, leading to the formation of a large market.

Under these backgrounds, some ideas of novel memories aiming to greatly exceed the limits of recording density are proposed.

For example, transition metal element-containing ternary oxides such as perovskite and spinel (see, for example, JP-A-2005-317787 and JP-A-2006-80259); binary oxides of a transition metal (see, for example, JP-A-2006-140464); and the like are studied. In case of using such a material, a principle in which a low-resistance state (ON) and a high-resistance state (OFF) can be repeatedly changed by application of a voltage pulse, and these two states are made corresponding to binary data of "0" and "1" to record the data is employed.

With respect to writing/erasing, for example, a method in which a pulse is applied in a reverse direction to each other with respect to the time of changing from the low-resistance state to the high-resistance state and the time of changing from the high-resistance state to the low-resistance state is employed in ternary oxides. On the other hand, in binary oxides, there may be the case where the writing/erasing is performed by applying a pulse having a different pulse amplitude or pulse width.

With respect to readout, it is performed by making a readout current flow to an extent that the writing/erasing does not occur in a recording material and measuring an electrical resistance of the recording material. In general, a ratio of the resistance in the high-resistance state and the resistance in the low-resistance state is about $10^3$.

The greatest merit of such materials resides in the matter that even when a device size is reduced to about 10 nm, the recording material is theoretically operable. In that case, since a recording density, of about 10 Tbpsi (terabits per square inch) can be realized, such is considered to be one of candidacies for high recording density.

As to an operation mechanism of such novel memories, the following are proposed. As to perovskite materials, diffusion of oxygen deficiency, charge accumulation in an interface level and the like are proposed. On the other hand, as binary oxides, diffusion of an oxygen ion, Mott transition and the like are proposed. Though it is hard to say that the details of the mechanism have been elucidated, since the same change in the resistance is observed in various material systems, such is noticeable as one of candidacies for high recording density.

Besides, MEMS (micro electro mechanical systems) memories using an MEMS technology are proposed. The greatest merit of such MEMS memories resides in the matter that the recording density can be tremendously enhanced because it is not necessary to provide a wiring in each recording part for recording a bit data. As to a recording medium and a recording principle, various proposals are made. By combining the MEMS technology with a new recording principle, attempts to achieve large improvements regarding consumption electric power, recording density, operation speed, etc. are made.

However, a novel information recording medium using such a new recording material has not been realized yet. As one of reasons for this, it is pointed out that the consumption electric power is large and that the heat stability in each resistance state is low (see, for example, S. Seo, et al., *Applied Physics Letters*, Vol. 85, pp. 5655-5657 (2004)).

SUMMARY OF THE INVENTION

An information recording and reproducing apparatus according to one aspect of the invention includes a recording layer and a unit for recording information by applying a voltage to the recording layer to generate a state change in the recording layer, the recording layer being configured of a material having a hollandite structure.

BRIEF DESCRIPTION OF THE DRAWINGS

FIG. 8 is a view showing a recording operation.
FIG. 9 is a view showing a reproducing operation.
FIG. 17 is a view showing an application embodiment of a flash memory.

DESCRIPTION OF THE PREFERRED EMBODIMENTS

Figure 1:
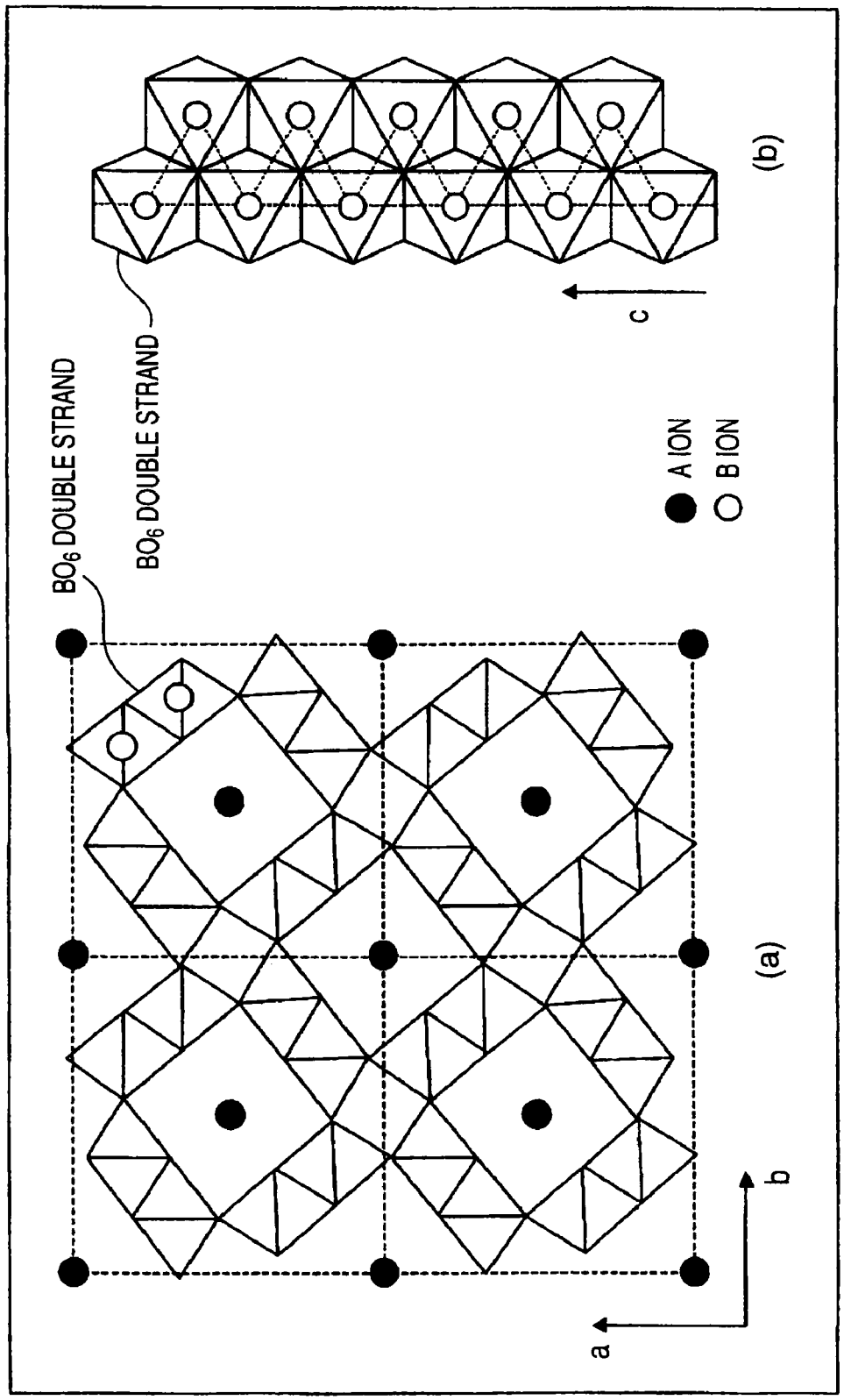
FIGS. 1A and 1B are each a view showing a structure of a recording material of the invention.

The invention is a nonvolatile information recording and reproducing apparatus with low power consumption and high thermal stability.

The present inventors made extensive and intensive investigations regarding a resistance change phenomenon in an oxide. As a result, it has been found that diffusion of a cation in the oxide and a change in the valence of the ion following this diffusion contribute to the resistance change phenomenon.

According to this, in order to generate the resistance change at a low power consumption, the diffusion of the cation may be made easy. On the other hand, in order to enhance the heat stability in each resistance state, it is important to stably keep the state after the cation has been diffused.

The invention has been made on the basis of such knowledge and uses an oxide material having a diffusion pass for the purpose of generating a resistance change at a low power consumption and having a crystal structure suitable for stably keeping the structure after the cation has been diffused in a recording layer material.

According to the invention, it is possible to realize a non-volatile information recording and reproducing apparatus capable of making it easy to diffuse a cation by using a recording layer having a hollandite structure and having high thermal stability at a low power consumption by stably keeping a matrix structure.

Best modes for carrying out an embodiment of the invention are hereunder described in detail with reference to the accompanying drawings.

1. Outline

In the information recording and reproducing apparatus according to an embodiment of the invention, a recording part has a stack structure of an electrode layer, a recording layer and an electrode layer (or a passivation layer).

By using a material having a hollandite structure in the recording layer, it is possible to make a consumption electric power necessary for the resistance change low and to enhance the heat stability.

Basic Principle of Recording/Reproduction:

A basic principle of recording/reproduction in the information recording and reproducing apparatus according to an embodiment of the invention is described.

FIG. 1A schematically shows a cross-sectional view of a (001) plane of a hollandite structure of a recording part. FIG. 1B is a schematic view showing a part of the hollandite structure of the recording part, in which a $BO_6$ double-stranded structure (as described later) composed of a $BO_6$ octahedron unit is seen from a vertical direction to the crystal c-axis. In FIGS. 1A and 1B, a black circle denotes an A ion; and a white circle denotes a B ion.

In each of FIGS. 1A and 1B, an oxygen ion existing in an apex of the octahedron unit is omitted.

As shown in FIGS. 1A and 1B, in the hollandite structure, plural $BO_6$ octahedron units sharing an edge constitute a double-stranded structure ($BO_6$ double strand), and the $BO_6$ double strands share an apex of the $BO_6$ octahedron units each other to constitute a tunnel wall, thereby forming a 2×2 tunnel structure ($\alpha$-$MnO_2$ structure). An extending direction of the tunnel is the crystal c-axis direction. Furthermore, an A ion is positioned in the tunnel, and the tunnel is a movement channel of the A ion. For this, by selecting the A ion species, it is possible to easily diffuse the A ion by an external electric field.

Here, the crystal structure name is described by a hollandite structure. However, there may be the case where a crystal of the same type structure is called by various different names, for example, cryptomelane, pridelite, coronadite, strontiomelane, ankangite and manjiroite, depending upon a difference of constitutional elements. All of them are hereunder described as the hollandite structure.

As to the selection manner of the crystal axis, there may be the case where the extending direction of a tunnel is the crystal b-axis depending upon a difference of the constitutional element. Here, all of the extending directions of a tunnel are described as the crystal c-axis.

In a hollandite compound, $A_xB_yO_{16}$, the valence of a transition metal B ion is specified by an electrical neutral condition of a cation A (monovalent to trivalent), a transition metal B ion and an anion $O^{2-}$. For example, in case of y=8.0 (the case where an element deficiency does not exist in the $BO_6$ double strand), the valence of the B ion in a state that the A ion does not exist ($BO_2$) is tetravalent, and an average valence (mixed valence) of the B ion is smaller than tetravalent due to the presence of the A ion.

Here, a resistance value of the $BO_6$ double strand varies with the valence of B in the $BO_6$ double strand.

In the invention, the movement of the A ion by the application of a voltage to the recording layer having a hollandite structure, the change of an average valence of the B ion which follows this and the resistance value change of the $BO_6$ double strand are respectively utilized as a recording principle.

The recording principle is hereunder described in detail with reference to the accompany drawings.

Figure 2:
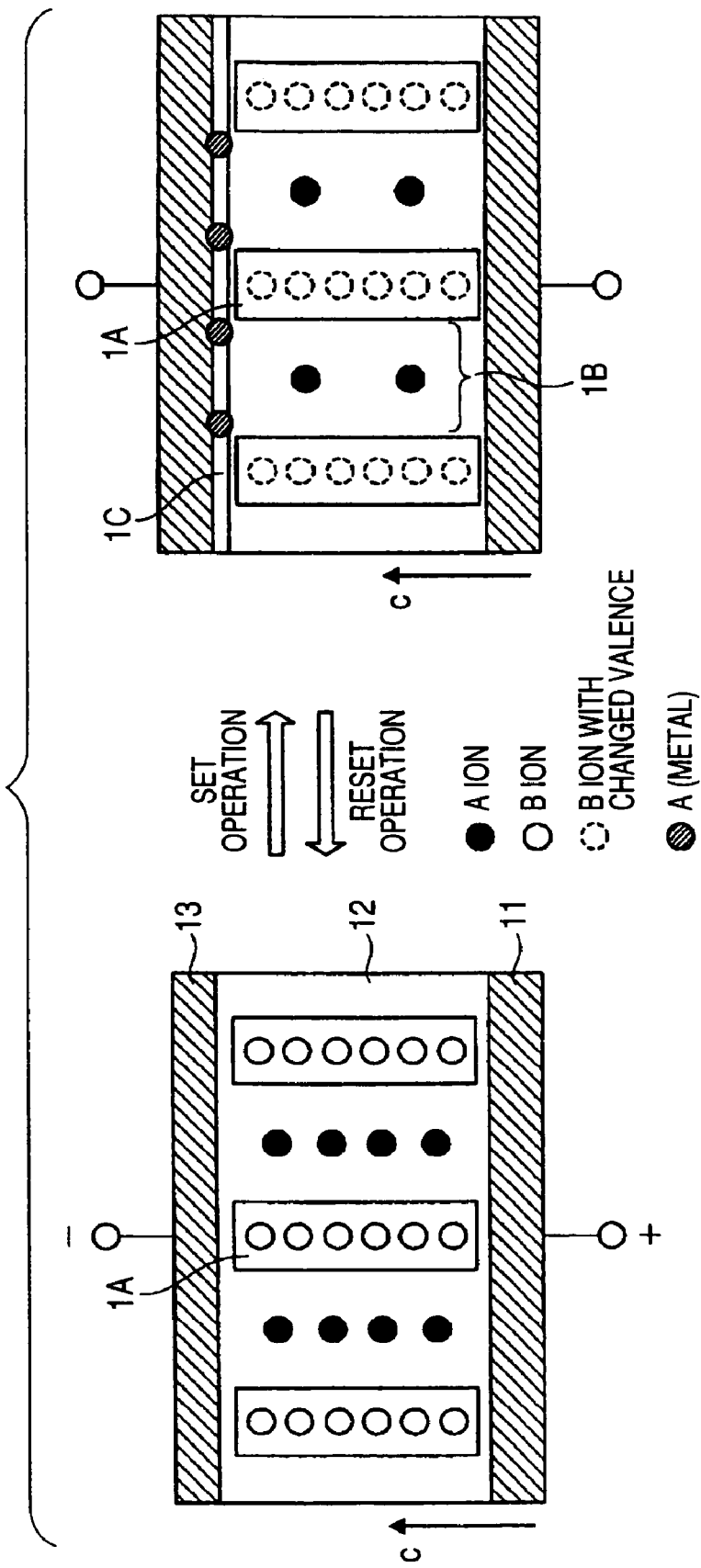
FIG. 2 is a view showing a recording principle.

FIG. 2 schematically shows a cross-sectional view of a substantially (110) plane of a hollandite structure of a recording part.

11 denotes an electrode layer; 12 denotes a recording layer: 13 denotes an electrode layer (or a passivation layer); 1A denotes a $BO_6$ double strand (see FIG. 1B); and 1B denotes a tunnel (space) of a 2×2 structure. A black circle denotes an A ion; a white circle denotes a B ion; and a broken-line white circle denotes a B ion with a changed valence.

In FIG. 2, an oxygen ion in the $BO_6$ double strand 1A is omitted.

When a voltage is applied to the recording layer 12 to generate a potential gradient in the recording layer 12, a part of the A ion moves in the tunnel. Then, in the invention, the information is recorded by rendering a first state of the recording layer 12 in a high resistance (insulator) state, changing the recording layer 12 by a potential gradient and rendering the recording layer 12 in a low resistance state as a second state.

Here, in this specification, the high resistance state is defined as a reset state; and the low resistance state is defined as a set state. That is, an initial state is the high resistance state.

However, this definition is made for the purpose of simplifying the following explanation, and there may be the case which is reverse to this definition, namely the case where the low resistance state is a reset (initial) state, whereas the high resistance state is a set state, depending upon the selection of a material and the manufacturing method. That is, needless to say, such a case falls within the scope of the invention.

First of all, for example, a state in which a potential of the electrode layer 13 is relatively lower than a potential of the electrode layer 11 is prepared. A negative potential may be applied to the electrode layer 13 by bringing the electrode layer 11 with a fixed potential (for example, a ground potential).

At that time, a part of the A ion in the recording layer 12 moves into the side of the electrode layer (cathode) 13, whereby the A ion in the recording layer (crystal) 12 relatively decreases with respect to the O (oxygen) ion. The A ion which has moved into the side of the electrode layer 13 receives an electron from the electrode layer 13 and deposits as an A atom as A metal, thereby forming a metal layer 1C.

Accordingly, in a region near the electrode layer 13, the A ion is reduced and acts as a metal, and therefore, its electric resistance largely decreases.

In the inside of the recording layer 12, the O ion becomes excessive, resulting in an increase of the average valence of the B ion in the $BO_6$ double strand 1A which remains without being diffused (the broken-line circle).

At that time, when the B ion is selected such that the electric resistance decreases due to an increase of the valence, the electric resistance decreases due to the movement of the A ion in both the metal layer 1C and the recording layer 12. Therefore, the state changes from a high resistance state to a low resistance state as a whole of the recording layer 12.

The information recording (set operation) is thus accomplished.

The information reproduction is performed by applying a voltage pulse to the recording layer 12 and detecting a resistance value of the recording layer 12. However, the amplitude of the voltage pulse is made minute to an extent that the movement of the A ion is not generated.

The foregoing process is a sort of electrolysis, and it can be considered that an oxidizing agent is formed due to electrochemical oxidation on the side of the electrode layer (anode) 11, whereas a reducing agent is formed due to electrochemical reduction on the side of the electrode layer (cathode) 13.

For that reason, in order to return the low resistance state to the high resistance state, an oxidation-reduction reaction of the recording layer 12 may be promoted by Joule heating the recording layer 12 by a large-current pulse. That is the A ion is returned to the thermally stable crystal structure 12 due to Joule heat by the large-current pulse, whereby the high resistance state appears (reset operation).

Separately from this, the reset operation can also be performed by applying a voltage pulse in the reverse direction to that at the time of set operation. That is, likewise the time of setting, a positive potential may be applied to the electrode layer 13 by bringing the electrode layer 11 with a fixed potential. Then, the A atom in the vicinity of the electrode layer 13 gives an electron to the electrode layer 13 and is converted into the A ion, which is then returned into the crystal structure 12 due to the potential gradient in the recording layer 12. According to this, in the B ion whose average valence has increased, its valence decreases to the same value as the initial value, and therefore, the state changes to a high resistance state (reset operation).

However, in order to put this operation principle to practical use, it must be confirmed that the reset operation is not generated at room temperature (to secure a sufficiently long retention time) and that a consumption electric power of the reset operation is sufficiently low.

It is possible to respond to the former by selecting an A ion having appropriate ionic radius and valence relative to the size of the tunnel. It is preferable that the A ion is monovalent and has a large ionic radius, or the valence of the A ion is divalent or polyvalent. According to this, it is possible to disturb the movement of the A ion at room temperature in a state that no potential gradient exists.

Also, it is possible to respond to the latter by finding out a movement channel of the A ion which moves in the recording layer (crystal) 12 without causing crystal break. As already described, in the hollandite structure, the $BO_6$ octahedron unit forms a 2×2 tunnel structure ($\alpha$-$MnO_2$ structure), which becomes a movement channel of the A ion. Furthermore, even when the A ion is deficient, this 2×2 tunnel structure can stably exist as a crystal.

Accordingly, intercalation/disintercalation of the A ion into the tunnel without causing crystal break becomes possible.

Furthermore, the size of a 2×2 tunnel in the hollandite structure is large as about 0.4 to 0.5 nm. For that reason, it is possible to accommodate even a relatively large cation in the tunnel, thereby bringing an advantage that the kind of an ion which can be selected is quite numerous. This matter widens the width of selection of the A ion for securing the foregoing retention time. Also, as described later, in order to further promote the stabilization, it is possible to select the A ion while employing the tunnel structure as a crystal structure.

In the light of the above, by using a recording layer material having a hollandite structure, it is possible to easily select elements and compositions for the purpose of satisfying the stability of the tunnel structure and the desired resistance value change which follows the movement of a tunnel ion at the same time.

Elements A and B and compositions x and y for carrying out the invention are hereunder described in more detail.

As to the element B, any material is useful so far as it includes at least one element capable of causing a change in the valence following the movement of the A ion. Specifically, any material including at least one kind of transition elements belonging to the Group 4 (Group IVA), Group 5 (Group VA), Group 6 (Group VIA), Group 7 (Group VIIA), Group 8 (Group VIII), Group 9 (Group VIII) and Group 10 (Group VIII), Group 11 (Group IB) is useful.

In that case, plural kinds of elements may be included as the element B. For example, in case of including two kinds of elements of an element B1 and an element B2, the general formula may be expressed by $A_x(B1)_{y-b}(B2)_b O_{16}$, with the sum of compositions of B1 and B2 being y. At that time, for example, B1 may be the foregoing transition element. B2 may be a transition element or may be a typical element.

Also, by incorporating other element B2 into the transition element B1 to form a solid solution, it is possible to adjust the resistance value of a tunnel skeleton ($BO_6$ double strand).

As the transition element belonging to the Group 4 (Group IVA) to the Group 11 (Group IB), transition elements which can become a divalent to pentavalent ion are preferable.

As more preferred transition metals which are included in the element B, ones which can become a tetravalent ion are exemplified. Specific examples thereof include Mn, Ti, V, Cr, Zr, Nb, Mo, Ru, Rh, Pd, Hf, Ta, W, Re, Os and Ir. In view of the matter that such an element can become a tetravalent ion, it is possible to easily form a $BO_6$ double strand.

Of these, Mn, Ti, V, Cr and Mo are more preferable, with Mn being especially preferable. In such a transition metal-containing $BO_6$ double strand, it is possible to cause a large resistance value change of the $BO_6$ double strand due to the change of valence of the transition element as described below.

Mn: Divalent or trivalent, and tetravalent
Ti: Trivalent and tetravalent
V: Trivalent and tetravalent
Cr: Divalent or trivalent, and tetravalent
Mo: Trivalent and tetravalent Here, while the valence of the transition element has been expressed by an integer value, in many cases, in view of the matter that a part of the transition element in the $BO_6$ double strand exhibits a change in the valence, the average valence is a non-integer value.

For example, in case of $A_x Mn_8 O_{16}$, the valence of Mn lays between trivalent and tetravalent in the initial state. In the case where the A ion entirely comes out ($\alpha$-$MnO_2$) Mn becomes tetravalent, whereas in the case where A ion partly comes out, the valence of Mn becomes a non-integer value which is closer to tetravalent than the valence in the initial state.

In case of $A_xMn_8O_{16}$, when A is a divalent ion, for example, $Ba^{2+}$, the resistivity at x> about 1.0 (valance of Mn< about 3.75) is from about $10^1$ to $10^3$ Ωcm. On the other hand, the resistivity of α-$MnO_2$ where A completely comes out (the valence of Mn is 4) is smaller than $10^1$ Ωcm. Accordingly, by extracting a part or the whole of the A ion from the inside of an $A_xMn_8O_{16}$ layer by application of a voltage to increase the valence of Mn, it is possible to make the layer resistance small. Similarly, in the case where A is an ion other than the divalent ion, or in the case where the composition y of Mn is other than 8.0, by extracting a part or the whole of the A ion to increase the valence of Mn, it is possible to make the layer resistance small.

Also, in the case where B is V, by extracting at least a part of the A ion in an $A_xV_yO_{16}$ layer to increase the valence of V (make it close to tetravalent), in general, it is possible to make the layer resistance large.

In the case where B is Ti, Cr or Mo, by extracting at least a part of the A ion in an $A_xB_yO_{16}$ layer to increase the valence of B, it is possible to change the layer resistance.

In the case where B is Mn, as described previously, the change of the resistance of an $A_xMn_yO_{16}$ layer which follows the movement of the A ion is expected. Also, an α-$MnO_2$ structure which is a tunnel skeleton exists as an extremely stable structure. Accordingly, it is possible to cause the movement of the A ion by application of a voltage while keeping the tunnel structure extremely stably.

Here, while transition metals which can become tetravalent have been exemplified as the transition metal capable of causing a change in the valence, as a matter of course, transition metals capable of causing a change in the valence, which do not become tetravalent, are useful, too. In that case, for example, when a typical element capable of becoming tetravalent is included in the plural kinds of the B element, the $BO_6$ double strand can be formed. For example, the B element may be a combination of a transition element B1 which does not become tetravalent and a tetravalent typical element B2.

Also, as described previously, in the case where other element B2 is incorporated into the transition element B1 to form a solid solution, it is preferable that B1 and B2 have substantially the same ionic radius. In that case, B2 may be a transition element, or may be a typical element. Also, the valence of B2 may be the same as or different from the valence of B1.

Examples of such a combination of B1 and B2 include a combination of Mn and one of Cr, Fe, Co, Ni, Cu and Al and a combination of Ti and one of Mg, Co, Ni, Cu, Zn, Al, Cr, Fe, Ga and Nb.

In case of adjusting the resistance value by the formation of a solid solution, for example, the resistance value can be decreased by incorporating Fe or Nb into $A_xTi_yO_{16}$ to form a solid solution as $A_xTi_{y-b}(Fe\ or\ Nb)_bO_{16}$.

As to the A ion, any ion which moves in the tunnel by application of a voltage and which is not readily returned to the original position in a state that no voltage is applied after the movement (keeps a retention time) is useful. The ion may be a complex ion-containing inorganic ion or organic ion. Also, the ion may include plural kinds of ions, in which at least one of them ensures the movement in the tunnel and the retention. In the case where plural kinds of ions are included, the valence of these ions may be the same or different.

Specific examples of the A ion include ions of alkali metals (Group 1 elements), alkaline earth metals (Group 2 elements), rare earth elements (Group 3 elements), transition elements belonging to the Group 4 to the Group 11, Group 12 elements, Group 13 elements, Group 14 elements and Group 15 elements. In that case, the A element may include plural kinds of A elements, and at least one of them may be, the foregoing element.

In the case where plural kinds of the A element are included, for example, when two kinds of an element A1 and an element A2 are included, the general formula may be expressed by $(A1)_{x-a}(A2)_aB_yO_{16}$ with the sum of A1 and A2 being x.

More specifically, elements having a large ionic radius or a large atomic weight are preferable from the viewpoint of keeping a retention time because the elements are inhibited to move in the tunnel.

Examples of such an element include Na, K, Rb, Cs and Ag.

A divalent or polyvalent ion hardly moves in the tunnel as compared with a monovalent ion because its coulomb restoring force from surrounding ions against the position change (movement) of the ion is larger than that of the monovalent ion. Examples of the ion which becomes divalent or polyvalent include Mg, Ca, Sr, Ba, La, Pr, Nd, Sc, Y, V, Cr, Mn, Fe, Co, Ni, Cu, Zn, Cd, Hg, Tl, Pb and Bi.

Of these elements, an element which becomes an ion capable of being coordinated in the tunnel can also be selected from the viewpoint of keeping the retention in addition to easiness of adequate movement of the ion in the tunnel. Examples of such an element include Fe, Co, Ni, Cu and Zn, each of which becomes a divalent ion and which becomes an ion capable of easily forming a tunnel skeleton and a coordination bond in the tunnel.

Also, from the viewpoint of keeping the retention, it is also possible to select, as the A element, an element capable of becoming a trivalent ion which is hardly movable as compared with a monovalent or divalent ion. Examples of such an element include La, Pr, Nd, Sc, Y, Al, Tl and Bi.

Also, it is possible to select the A element from the viewpoint of more enhancing the stability as a crystal structure of the 2×2 tunnel structure. In that case, it is desirable that the A element has a large ionic radius. The A element moves and takes on the responsibility of contributing to a change in the valence of B.

Furthermore, in case of using plural kinds of elements as A, it may be considered to combine an A1 ion which moves and contributes to a change in the valence of B and an A2 ion taking on the responsibility of keeping the stability of the 2×2 tunnel structure. At that time, it may be considered to use, as the A1 ion, an ion having a relatively small ionic radius and to use, as the A2 ion, an ion which is hardly movable.

Also, the A1 and A2 ions may coexist in the same tunnel, or the A1 and A2 ions may exist in a different tunnel. Also, the composition of the A1 and A2 ions in a different tunnel may be different.

Furthermore, in case of using plural kinds of elements as A, it may be considered to combine an A1 ion which is easily movable and an A2 ion which is hardly movable and to set up the valence of B at a value in a valence region of B just before the $BO_6$ double strand abruptly changes in the resistance due to the composition of the A2 ion which is hardly movable.

According to this, it is possible to cause an abrupt change in the resistance value only by the movement of a small amount of the A1 ion by application of a voltage.

As shown in FIG. 2, in order that intercalation/disintercalation may be efficiently generated in the tunnel of the A ion by application of a voltage, it is preferable that the movement direction of the A ion and the direction of an applied electric field are consistent.

As shown in FIG. 2, it is preferable that the A ion is oriented in such a manner that the extending direction of the tunnel of the recording layer crystal (c-axis direction) is in parallel to the direction of the applied electric field, namely the recording layer is oriented on the c-axis.

Figure 27:
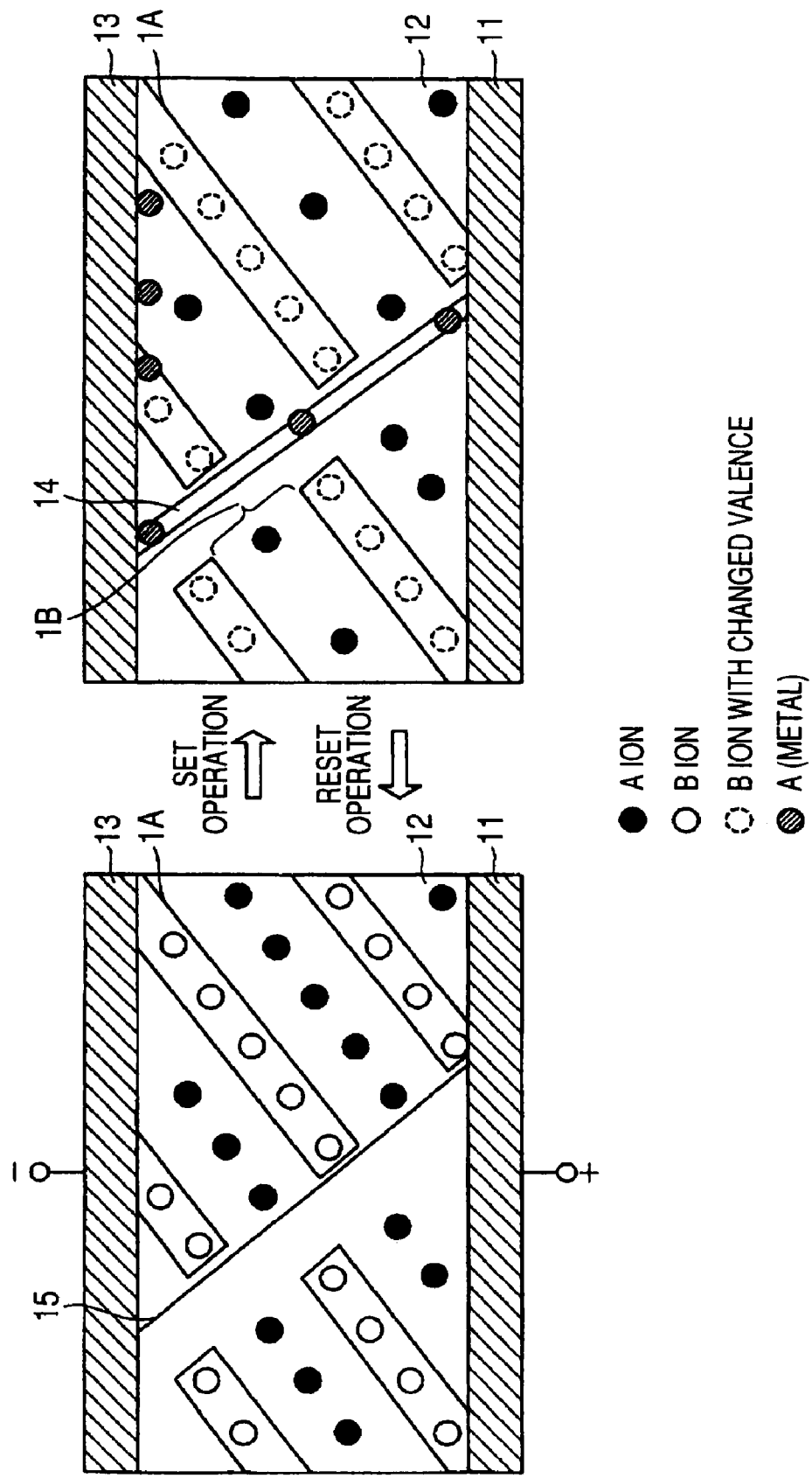
FIG. 27 is a view showing a recording principle.

However, as shown in FIG. 27, even when the movement direction of the A ion is not completely coincident with the direction of the applied electric field, the effects of the invention can be obtained.

Also, FIG. 27 shows a crystal grain boundary 15. Regardless of whether the movement direction of the A ion and the direction of the applied electric field are consistent or inconsistent, even in the case where such crystal grain boundary 15 exists, the effects of the invention can be obtained.

Finally, an optimal value of a mixing ratio of the respective atoms is described.

As explained with reference to FIG. 2, since the structure in which the A ion comes out is able to stably exist, it is possible to optimize a mixing ratio of the A and B ions such that the resistance of each state or a coefficient of diffusion of the A ion becomes an optimal value.

As to the composition y of the B element, in the tunnel structure in which the A ion entirely comes out ($\alpha$-$MnO_2$ structure), in the case where an element deficiency does not exist, y is 8.0 (B is tetravalent).

In the case where the B element is deficient, in order that the tunnel structure may stably exist, it is preferable that the deficiency is up to about 10%, namely, a lower limit of y is about 7.0. Also, in the case where an O (oxygen) element is deficient, it is preferable that the deficiency is up to about 10%, namely, an upper limit of y is about 9.0.

Accordingly, ($7.0 \leq y \leq 9.0$) is preferable. From the viewpoints of more stably keeping the tunnel structure and further suppressing the movement of an oxygen ion, ($7.5 \leq y \leq 8.5$) is more preferable, By intentionally making the B element or O (oxygen) element deficient within the range of the composition y for stably keeping the tunnel structure, it is possible adjust the resistance value of the tunnel skeleton.

As to the composition x of the A element, in view of the upper limit of the number of the A ion capable of existing in the tunnel, an upper limit of x is preferably about 2.0. Also, a lower limit of x is the state that the A ion entirely comes out, namely, x=0. Accordingly, ($0 \leq x \leq 2.0$) is preferable.

Now, since an oxidizing agent is formed on the side of the electrode layer (anode) 11 after the set operation, it is preferable that the electrode layer 11 is constituted of a material which is hardly oxidized (for example, electrically conductive nitrides and electrically conductive oxides). Also, as such a material, ones having no ion conductivity are preferable.

Examples of such a material include those described below. Of these, $LaNiO_3$ is the most preferable material from the standpoints of overall performance inclusive of good electric conductivity.

M1N:

M1 includes at least one element selected from the group consisting of Ti, Zr, Hf, V, Nb and Ta. N represents nitrogen.

$M1O_x$:

M1 includes at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt. The molar ratio x satisfies the relationship of $1 \leq x \leq 4$.

$AMlO_3$:

A includes at least one element selected from the group consisting of La, K, Ca, Sr, Ba and Ln (lanthanide).

M1 includes at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt.

O represents oxygen.

$A_2MlO_4$

A includes at least one element selected from the group consisting of K, Ca, Sr, Ba and Ln (lanthanide).

M1 includes at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt.

O represents oxygen.

Also, since a reducing agent is formed on the side of the electrode layer (cathode) 13 after the set operation, it is preferable that the electrode layer 13 has a function to prevent a reaction of the recording layer 12 with air from occurring.

Examples of such a material include amorphous carbon, diamond-like carbon and semiconductors such as $SnO_2$.

The electrode layer 13 may be made to have a function as a passivation layer for passivating the recording layer 12, and a passivation layer other than the electrode layer 13 may be newly formed. In that case, the passivation layer may be an insulator, or may be a conductor.

Also, for the purpose of efficiently performing the heating of the recording layer 12 in the reset operation, a heater layer (a material having a resistivity of about $10^{-5}$ $\Omega$cm or more) may be provided on the side of the cathode, herein, on the side of the electrode layer 13.

Also, at least one of the electrode layers 11 and 13, or the surface layer of at least one of the electrode layers 11 and 13 on the side of the recording layer 12 may be a metal layer or an alloy layer including the element A of $A_xB_yO_{16}$. In that case, it is preferable that the layer including the element A is chemically stable.

When a layer including the element A exists in contact with the recording layer 12, the reset operation by an applied voltage, namely the intercalation operation of the recording layer into the tunnel by the A ion is efficiently performed, resulting in a reduction of the reset consumption electric power. Examples of such an element A include Cu, Ag and Zn.

In case of providing a layer including the element A in contact with the recording layer 12, a hollandite structure in which the A ion substantially comes out (in $A_xB_yO_{16}$, x is close to zero) may be used as an initial state of the recording layer 12. Since the A ion substantially comes out, the initial state is a low resistance state, and by introducing the A ion into only the surface layer in contact with the layer including the element A in the recording layer 12 by the intercalation operation into the tunnel by application of a voltage, it is possible to render the recording layer in a high resistance state.

Examples of such a method include a method in which an $\alpha$-$MnO_2$ layer and the layer including the element A are stacked, and only the surface layer of the $\alpha$-$MnO_2$ layer is converted into $A_xMn_8O_{16}$ with high resistance by the intercalation operation into the tunnel by application of a voltage.

A second compound having a vacant site capable of accommodating the A ion therein may be provided in contact with a first compound of the information recording and reproducing apparatus of the invention.

First of all, the case where the second compound has a hollandite structure is hereunder described.

The second compound has a hollandite structure having a different element composition from the first compound and is represented by a general formula 2: $C_zD_wO_{16}$ (wherein $0 \leq z \leq 2.0$, and $7.0 \leq w \leq 9.0$).

Here, C include at least one element selected from the group consisting of alkali metals (Group 1 elements), alkaline earth metals (Group 2 elements), rare earth elements (Group 3 elements), transition elements belonging to the Group 4 to the Group 11, Group 2 elements, Group 13 elements, Group 14 elements and Group 15 elements; and D includes at least one of transition elements belonging to the Group 4 (Group IVA) to the Group 11 (Group IB).

Figure 3:
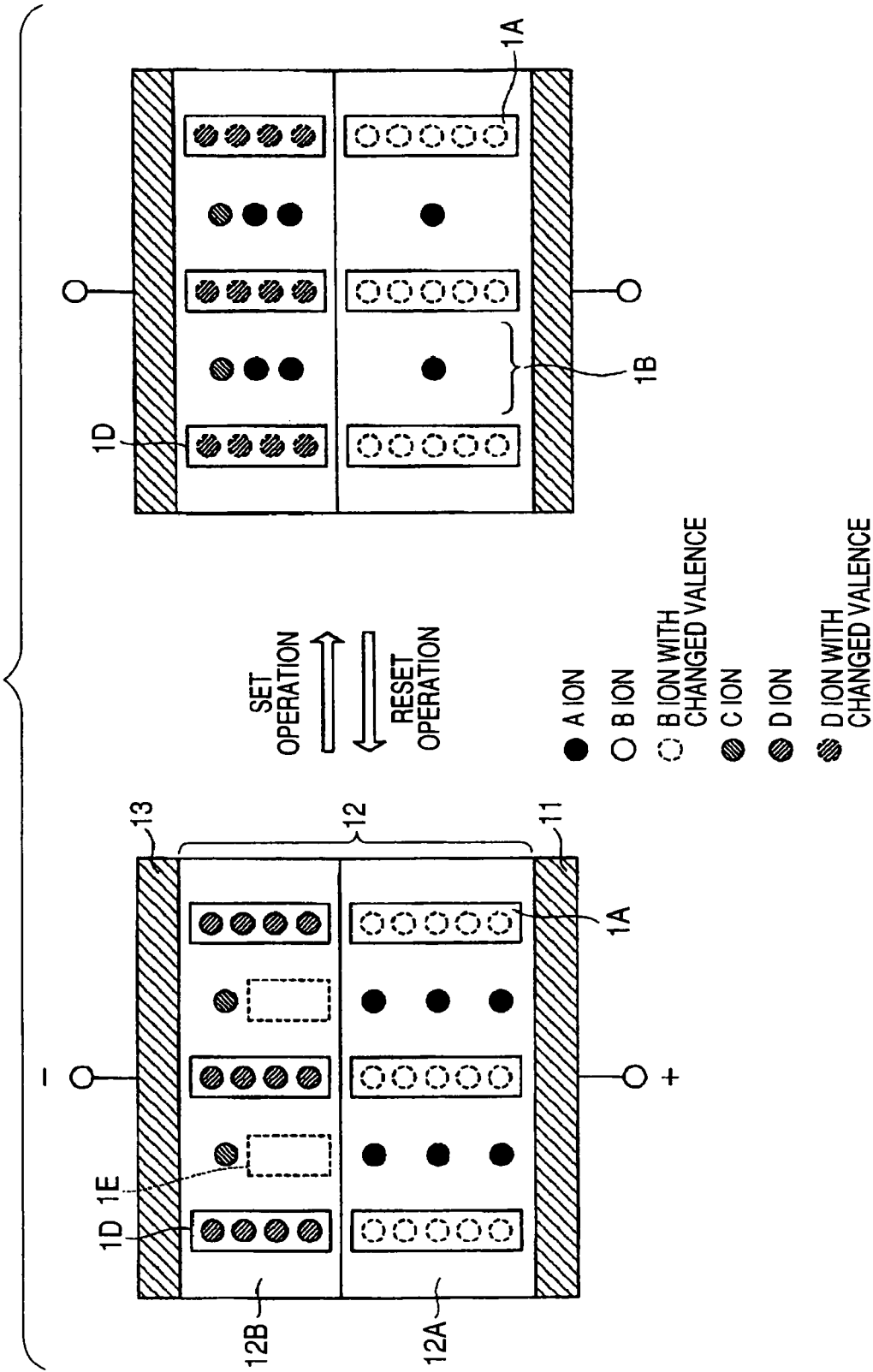
FIG. 3 is a view showing a recording principle.

In FIG. 3, in a $BO_6$ double strand 1A in a first compound 12A, a white circle denotes a B ion; and a black circle denotes an A ion. Also, a broken-line white circle denotes a B ion with a changed valence. Furthermore, in a $BO_6$ double strand 1D in a second compound 12B, a circle with right oblique lines denotes a D ion; and a circle with left oblique lines denotes a C ion. A broken-line circle with oblique lines denotes a D ion with a changed valence.

In FIG. 3, an oxygen ion in the double strands 1A and 1D is omitted. Also, each of the first and second compounds 12A and 12B constituting the recording layer 12 may be stacked in plural layers of two or more layers.

In such recording layer 12, a potential is applied to the electrode layers 11 and 13 in such a manner that the first compound 12A is located on the side of an anode, with the second compound 123 being located on the side of a cathode, and when a potential gradient is generated in the recording layer 12, a part of the A ion in the first compound 12A moves in the tunnel in the crystal and penetrates into a vacant site 1E in the tunnel in the second compound 12B on the side of the cathode.

At that time, the resistance of the second compound layer 12B may not be changed, or may be changed. The resistance may changed as a whole of the recording layer 12 of the sum of the first compound 12A and the second compound 12B.

Also, the second compound 12B and the first compound 12A may be different in the element species ((C, D) and (A, B) are different), or may be the same in the element species but different only in-the composition ((z, w) and (x, y) are different).

The following are exemplified as the second compound 12B.

In the case where even when the A ion penetrates into the vacant site 1E, the conductivity of the second compound 12B is high, examples of the D element include Ru. Also, by adjusting the C element, V or Mo maybe used as the D element. At that time, the first compound 12A and the second compound 12B are different in the element species or composition.

The foregoing are merely an example, and any compound is useful so far as the resistance of the recording layer 12 is changed due to the penetration of the A ion into the vacant site 1E of the second compound 12B.

It is preferable that the second compound 12B epitaxially grows relative to the first compound 12A. This is because in view of the epitaxial growth, the movement of the A ion from the first compound 12A into the vacant site 17 of the second compound 12B is smoothly achieved without breaking the crystal structure of the second compound 12B.

Next, the case where the second compound does not have a hollandite structure is hereunder described.

Figure 4:
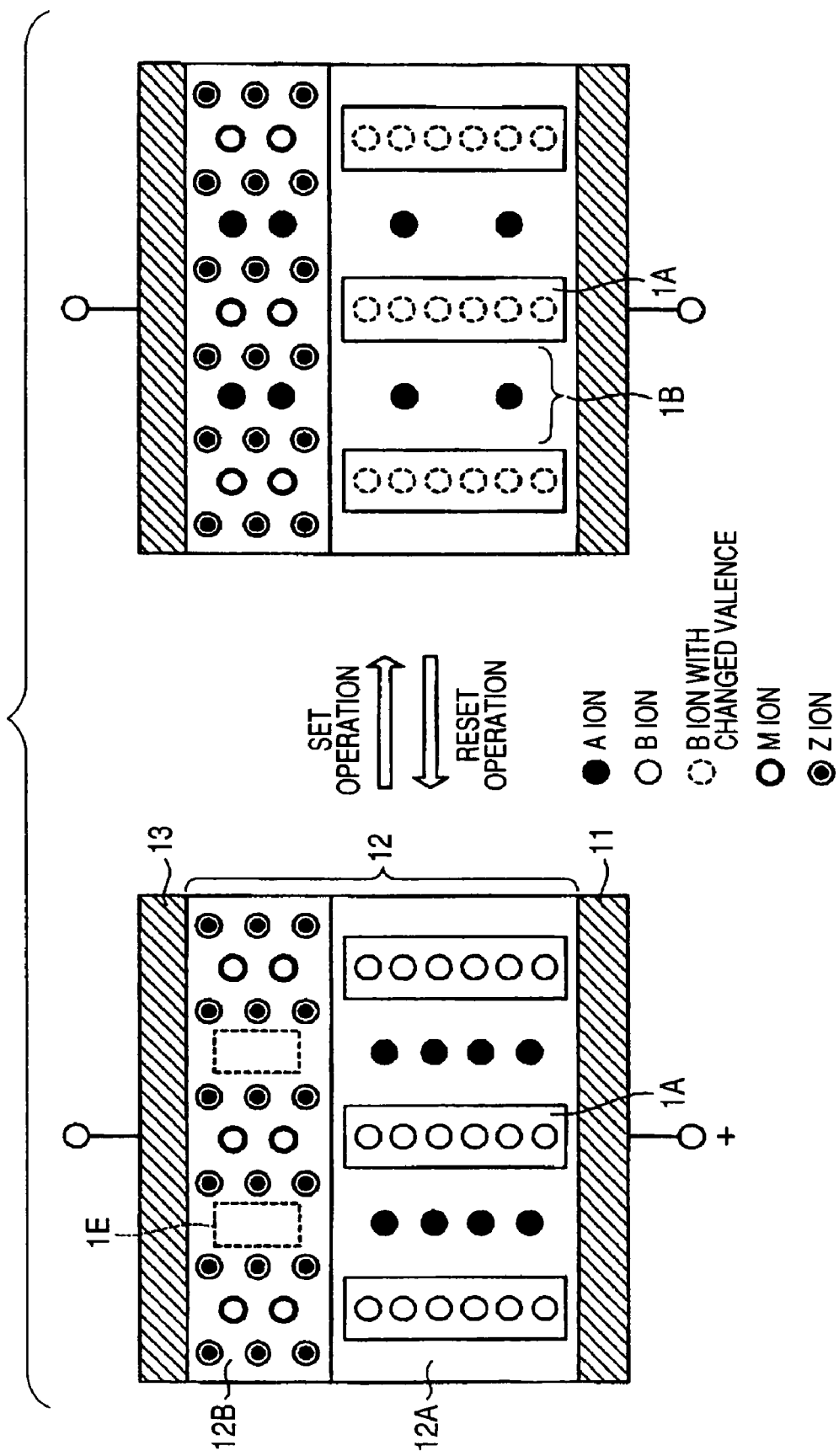
FIG. 4 is a view showing a recording principle.

In FIG. 4, a black circle, a full-line white circle and a broken-line white circle in the first compound 12A denote the same symbols in the first compound 12A in FIG. 3, respectively. An oxygen ion in the first compound 12A is omitted. A black circle in the second compound 12B denotes an A ion; a bold-line white circle denotes an M ion; and a blotted white circle denotes a Z ion.

Each of the first and second compounds 12A and 12B constituting the recording layer 12 may be stacked in plural layers of two or more layers.

In such a recording part, a potential is applied to the electrode layers 11 and 13 in such a manner that the first compound 12A is located on the side of an anode, with the second compound 12B being located on the side of a cathode, and when a potential gradient is generated in the recording layer 12, a part of the A ion in the first compound 12A moves and penetrates into the second compound 12B on the side of the cathode. Since the vacant site 13 capable accommodating the A ion therein exists in the crystal of the second compound 12B, the A ion which has moved from the first compound 12A is accommodated in this vacant site 1E.

Accordingly, the valence of a part of the B ion increases in the first compound 12A increases, and the valence of the M ion decreases in the second compound 12B. Accordingly, the M ion must be an ion composed of a transition element.

That is, on the assumption that the first and second compounds 12A and 12B are in a high resistance state (insulator) in the initial state (reset state), when a part of the A ion in the first compound 12A moves into the second compound 12B, a conductive carrier is generated in the crystals of the first and second compounds 12A and 12B, whereby the both compounds have electric conductivity.

In such a way, by giving a current/voltage pulse to the recording layer 12, an electric resistance value of the recording layer 12 becomes small, and therefore, the set operation (recording) is realized.

The reset operation due to an oxidation-reduction reaction can also be achieved by making the Fermi level of an electron of the first compound 12A lower than the Fermi level of an electron of the second compound 12B. Simultaneously with the movement of a cation at the time of set operation, the electron moves from the first compound 12A to the second compound 12B. By making the Fermi level of an electron of the second compound 12B higher than the Fermi level of an electron of the first compound 12A, the total energy of the recording layer 12 increases. Accordingly, the reset operation due to an oxidation-reduction reaction becomes possible.

The foregoing is summarized as follows.

In the case where the recording layer includes at least the first compound having a hollandite structure, the first compound is at least represented by a general formula 1: $A_xB_yO_{16}$ (wherein $0 \leq x \leq 2.0$, and $7.0 \leq y \leq 9.0$).

In the general formula 1, B includes at least one of transition elements belonging to the Group 4 (Group IVA) to Group 11 (Group IB). B includes at least one element selected from the group consisting of Mn, Ti, V, Cr, Zr, Nb, Mo, Ru, Rh, Pd, Hf, Ta, W, Re, Os and Ir.

A includes at least one element selected from the group consisting of alkali metals (Group 1 elements), alkaline earth metals (Group 2 elements), rare earth elements (Group 3 elements), transition elements belonging to the Group 4 to the Group 11, Group 12 elements, Group 13 elements, Group 14 elements and Group 15 elements. A includes at least one element selected from the group consisting of Na, K, Rb, Cs, Mg, Ca, Sr, Ba, La, Pr, Nd, Sc, Y, V, Cr, Mn, Fe, Co, Ni, Cu, Zn, Cd, Hg, Ag, Ti, Pb and Bi.

It is preferable that the c-axis of the crystal of the first compound having a hollandite structure is in parallel to the direction of the applied electric field by application of a voltage. Also, it is preferable to have a metal or alloy layer including the A element in contact with the first compound.

In case of having the second compound having a vacant site capable of accommodating the A element therein in contact with, the first compound, the second compound is, represented by a general formula 2: $C_zD_wO_{16}$ (wherein $0 \leq z \leq 2.0$, and $7.0 \leq w \leq 9.0$) and has a hollandite structure having a different element composition from the first compound.

In the general formula 2, C includes at least one element selected from the group consisting of alkali metals (Group 1 elements), alkaline earth metals (Group 2 elements), rare earth elements (Group 3 elements), transition elements belonging to the Group 4 to the Group 11, Group 12 elements, Group 13 elements, Group 14 elements and Group 15 elements; and D includes at least one of transition elements belonging to the Group 4 (Group IVA) to the Group 11 (Group IB).

The second compound is constituted of one of the following materials.

  General formula 3

In the general formula 3, □ represents a vacant site in which the A element is accommodated; M includes at least one element selected among Ti, V, Cr, Mn, Fe, Co, Ni, Nb, Ta, Mo, W, Re, Ru and Rh; Z includes at least one element selected among O, S, Se, N, Cl, Brand I; and $0.3 \leq x \leq 1$.

  General formula 4

In the general formula 4, □ represents a vacant site in which the A element is accommodated; M includes at least one element selected among Ti, V, Cr, Mn, Fe, Co, Ni, Nb, Ta, Mo, W, Re, Ru and Rh; Z includes at least one element selected among O, S, Se, N, Cl, Br and I; and $1 \leq x \leq 2$.

  General formula 5

In the general formula 5, □ represents a vacant site in which the A element is accommodated; M includes at least one element selected among Ti, V, Cr, Mn, Fe, Co, Ni, Nb, Ta, Mo, W, Re, Ru and Rh; Z includes at least one element selected among O, S, Se, N, Cl, Br and I; and $1 \leq x \leq 2$.

  General formula 6

In the general formula 6, □ represents a vacant site in which the A element is accommodated; M includes at least one element selected among Ti, V, Cr, Mn, Fe, Co, Ni, Nb, Ta, Mo, W, Re, Ru and Rh; P represents a phosphorus element; O represents an oxygen element; $0.3 \leq x \leq 3$; and $4 \leq x \leq 6$.

It is preferable that the second compound has one of a ramsdelite structure, an anatase structure, a brookite structure, a pyrolusite structure, an $ReO_3$ structure, an $MoO_{1.5}PO_4$ structure, a $TiO_{0.5}PO_4$ structure, an $FePO_4$ structure, a $\beta\text{-}MnO_2$ structure, a $\gamma\text{-}MnO_2$ structure and a $\lambda\text{-}MnO_2$ structure.

3. Modes for Carrying Out the Invention

Next, some modes which are considered to be the best are hereunder described.

An embodiment of the invention is hereunder described with respect to two of the case of applying to a probe memory and the case of applying to a semiconductor memory.

(1) Probe Memory:

A. Structure

Figure 5:
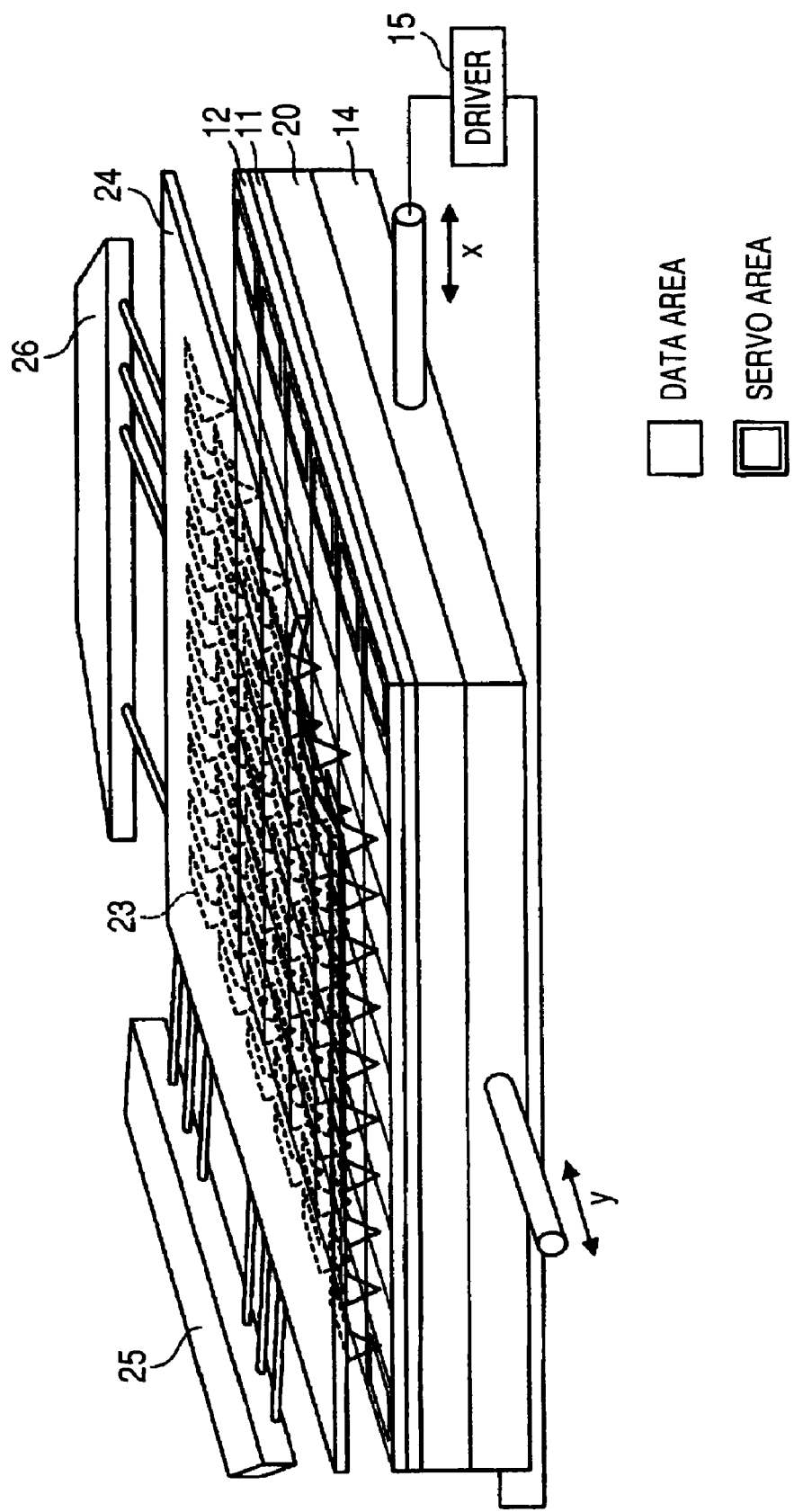
FIG. 5 is a view showing a probe memory according to an embodiment of the invention.
Figure 6:
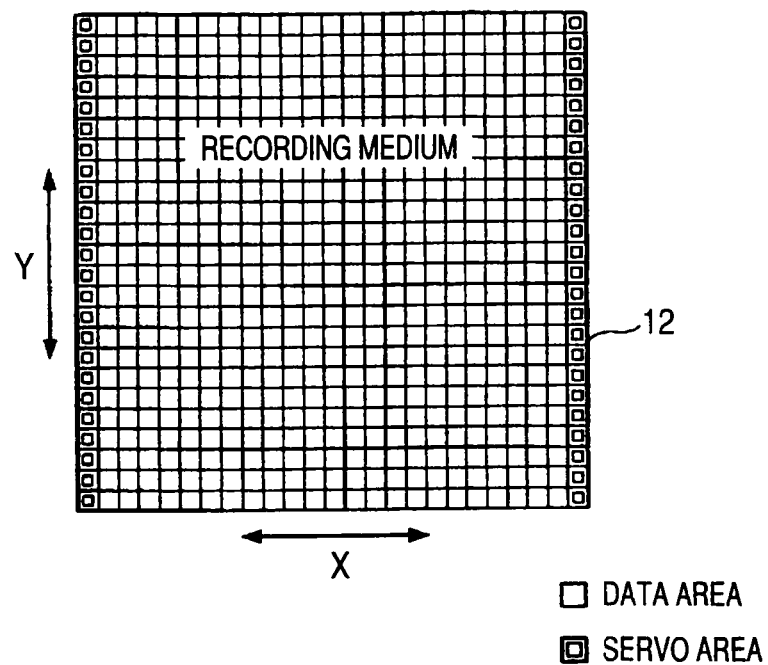
FIG. 6 is a view showing the partition of a recording medium.

FIGS. 5 and 6 each shows a probe memory according to an embodiment of the invention.

An electrode layer 11 is disposed on a semiconductor substrate 20; and a recording layer 12 having a data area and a servo area is disposed on the electrode 11. The recording layer 12 is, for example, configured of a recording medium (recording part) having the structure as shown in FIG. 1. The recording medium is solid formed in a central part of the semiconductor substrate 20.

The servo area is disposed along an edge of the semiconductor substrate 20. Each of the data area and the servo area is configured of plural blocks. Plural probes 23 are disposed corresponding to the plural blocks on each of the data area and the servo area. Each of the plural probes 23 has an acute shape.

The plural probes 23 configure a probe array, which is formed on the side of one surface of a semiconductor substrate 24. The plural probes 23 can be easily formed on the side of one surface of the semiconductor substrate 24 by utilizing the MEMS technology.

The position of the probe 23 on the data area is controlled by a servo burst signal to be read out from the servo area. Specifically, an access operation is carried out by reciprocating the semiconductor substrate 20 in an X direction and position controlling the plural probes 23 in a Y direction by a driver 15.

By independently forming a recording medium for every block and making the recording medium have a structure such that it is rotated in a circle such as a hard disk, each of the plural probes 23 may be moved in a radius direction of the recording medium, for example, in an X direction.

Each of the plural probes 23 has a function as a recording/erasing head and a function as a reproducing head. Multiplex drivers 25 and 26 supply a prescribed voltage to the plural probes 23 at the times of recording, reproducing and erasing.

B. Recording/Reproducing Operation

The recording/reproducing operation of the probe memory as shown in FIGS. 5 and 6 is described.

Figure 7:
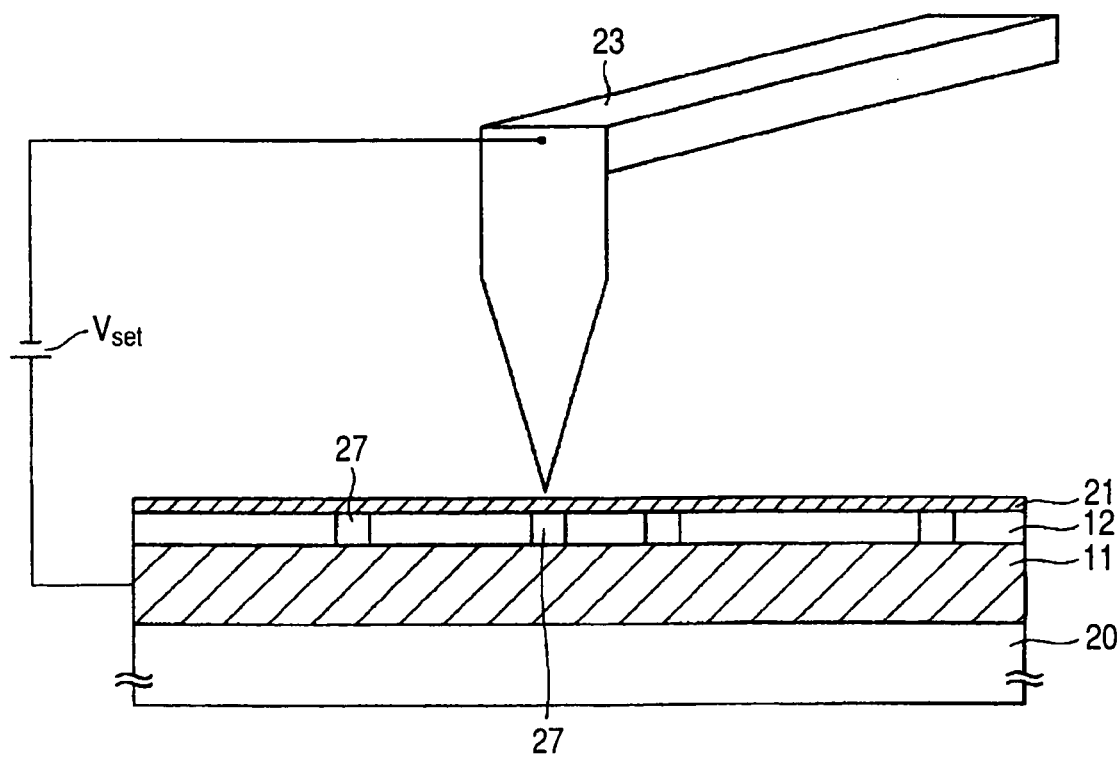
FIG. 7 is a view showing the behavior at the time of information recording.

FIG. 7 shows a recording operation (set operation).

The recording medium is composed of the electrode layer 11, the recording layer 12 and a passivation layer 21 on the semiconductor chip 20. The passivation layer 21 is configured of a resistor. It is preferable that the resistance value of the passivation layer 21 is larger than a minimum resistance value and smaller than a maximum resistance value of a recording unit 27.

The recording operation is performed by bringing a tip of the probe 23 into contact with the surface of the passivation layer 21 and applying a voltage to the recording unit 27 of the recording layer (recording medium) 12 to generate a potential gradient in the recording unit 27 of the recording layer 12. In this embodiment, a state that the potential of the probe 23 is relatively lower than the potential of the electrode layer 11 is prepared. A negative potential may be applied to the probe 23 by bringing the electrode layer 11 with a fixed potential (for example, a ground potential).

A voltage pulse can also be generated and applied by emitting an electron from the probe 23 towards the electrode layer 11 by using, for example, an electron generating source or a hot electron source.

At that time, for example, as shown in FIG. 8, in the recording unit 27 of the recording layer 12, a part of the A ion moves into the side of the probe (cathode) 23, whereby the A ion in the crystal relatively decreases relative to the O ion. Also, the A ion which has moved into the side of the probe 23 receives an electron from the probe 23 and deposits as a metal.

In the recording unit 27 of the recording layer 12, the O ion becomes excessive, resulting in an increase of the valence of the B ion remaining in the recording layer 12. That is, since the recording unit 27 of the recording layer 12 has electron conductivity by the injection of a carrier due to a phase change, the information recording (set operation) is accomplished.

A voltage pulse for achieving the information recording can also be generated by preparing a state that the potential of the probe 23 is relatively higher than the potential of the electrode layer 11.

According to the probe memory of this embodiment, not only the information recording can be performed on the recording unit 27 of the recording medium, but a recording density which is higher than that in related-art hard disks and semiconductor memories can be realized by employing a novel recording material.

The reproducing operation is described with reference to FIG. 9.

The reproducing operation is performed by making a voltage pulse flow in the recording unit 27 of the recording layer 12 and detecting a resistance value of the recording unit 27 of the recording layer 12. However, the voltage pulse is a minute value to a degree that the material constituting the recording unit 27 of the recording layer 12 does not cause a change in the state.

For example, a readout current generated from a sense amplifier S/A is made to flow from the probe 23 into the recording unit 27 of the recording layer (recording medium) 12, and a resistance value of the recording unit 27 is measured by the sense amplifier S/A. By employing the previously described novel material, it is possible to secure a ratio in resistance between the high resistance state and the low resistance state of $10^3$ or more.

As to the reproducing operation, it is possible to achieve continuous reproduction by scanning by the probe 23 on the recording medium.

An erasing (reset) operation is performed by Joule heating the recording unit 27 of the recording layer 12 by a large-current pulse and promoting an oxidation-reduction reaction in the recording unit 27 of the recording layer 12. Alternatively, the erasing can be performed by applying a voltage pulse which is reversal to that at the time of setting to the recording layer 12.

The erasing operation can be performed in every recording unit 27 or can be performed in a plurality or block unit of the recording unit 27.

Figure 10:
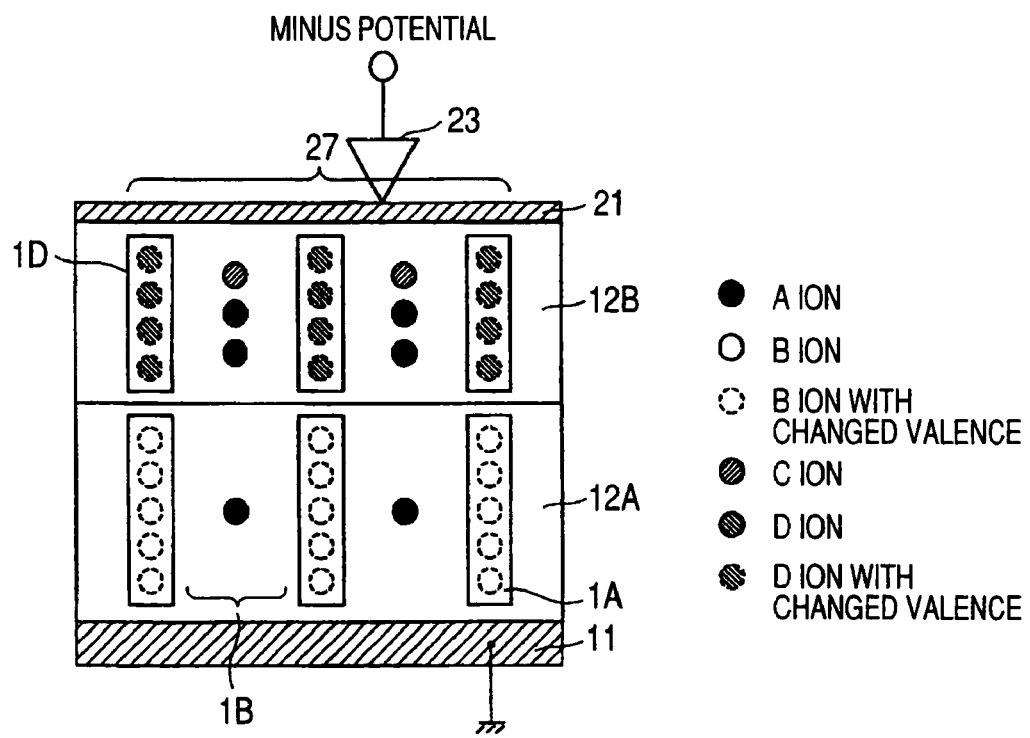
FIG. 10 is a view showing a recording operation.
Figure 11:
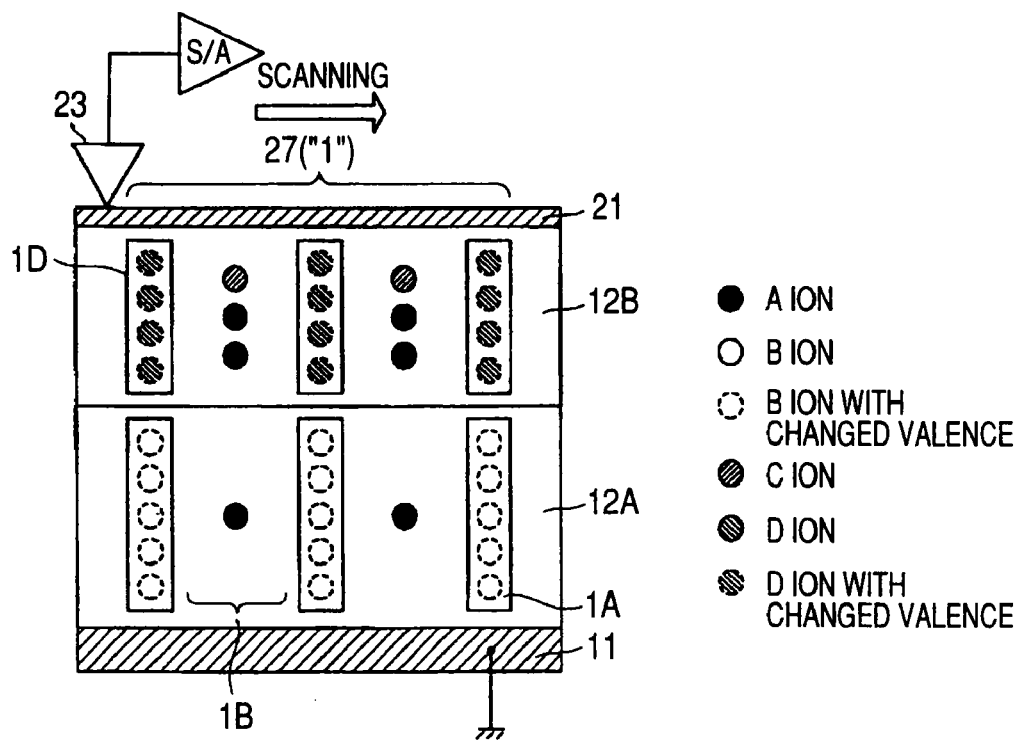
FIG. 11 is a view showing a reproducing operation.

FIG. 10 shows the recording operation in the structure as shown in FIG. 3; and FIG. 11 shows the reproducing operation in the structure as shown in FIG. 3.

C. Experimental Example

A recording medium having the structure as shown in FIG. 7 is used as a sample, and the evaluation is performed by using a pair of probes with an acute tip having a diameter of not more than 10 nm.

The electrode layer 11 is, for example, a Pt layer formed on a semiconductor substrate. In order to enhance the adhesiveness between a semiconductor substrate and a lower electrode, Ti of about 5 nm may be used as an adhesive layer. The recording layer 12 can be obtained by employing a so-called sol-gel method of coating a sol having adjusted components so as to obtain a desired composition ratio and then baking it, or RF magnetron sputtering using a target having adjusted components so as to obtain a desired composition ratio. Furthermore, for example, diamond-like carbon may be formed as a passivation layer by a CVD method. The thickness of each layer can be designed so as to optimize a resistance ratio between a low resistance state and a high resistance state, energy required for switching, a switching speed and the like.

The pair of probes is brought into contact with the passivation layer 21, and writing/erasing is carried out by using one of the probes. For example, the writing is performed by applying a voltage pulse of 1 V in a width of, for example, 10 nsec to the recording layer 12. On the other hand, for example, the erasing can be performed by applying a voltage pulse of 0.2 V in a width of, for example, 100 nsec to the recording layer 12.

Also, readout is carried out by using the other probe between writing and erasing. The readout can be performed by applying a voltage pulse of 0.1 V in a width of 10 nsec to the recording layer 12 and measuring a resistance value of the recording layer (recording bit) 12.

For example, in case of using $BaMn_8O_{16}$ having a hollandite structure as the recording layer; since a Ba ion exists in a tunnel of structurally stable $\alpha$-$MnO_2$ having a 2×2 tunnel structure, the movement of the Ba ion is efficiently generated. Also, after the Ba ion has become deficient due to the movement, the valence of the Mn ion remaining in the recording medium 12 increases and becomes close to tetravalent, and therefore, the recording layer 12 becomes low in the resistance.

At that time, the moved Ba ion is not readily returned to the original position in a state that no voltage is applied, and therefore, the recording state stably exists. Also, since the crystal is stably kept in the recording layer 12 in a state that the Ba ion is deficient, it is possible to minimize a electric power required for switching from the low resistance state to the high resistance state.

D. Summary

According to such a probe memory, it is possible to realize higher recording density and lower consumption electric power than those in the current hard disks and flash memories.

Figure 12:
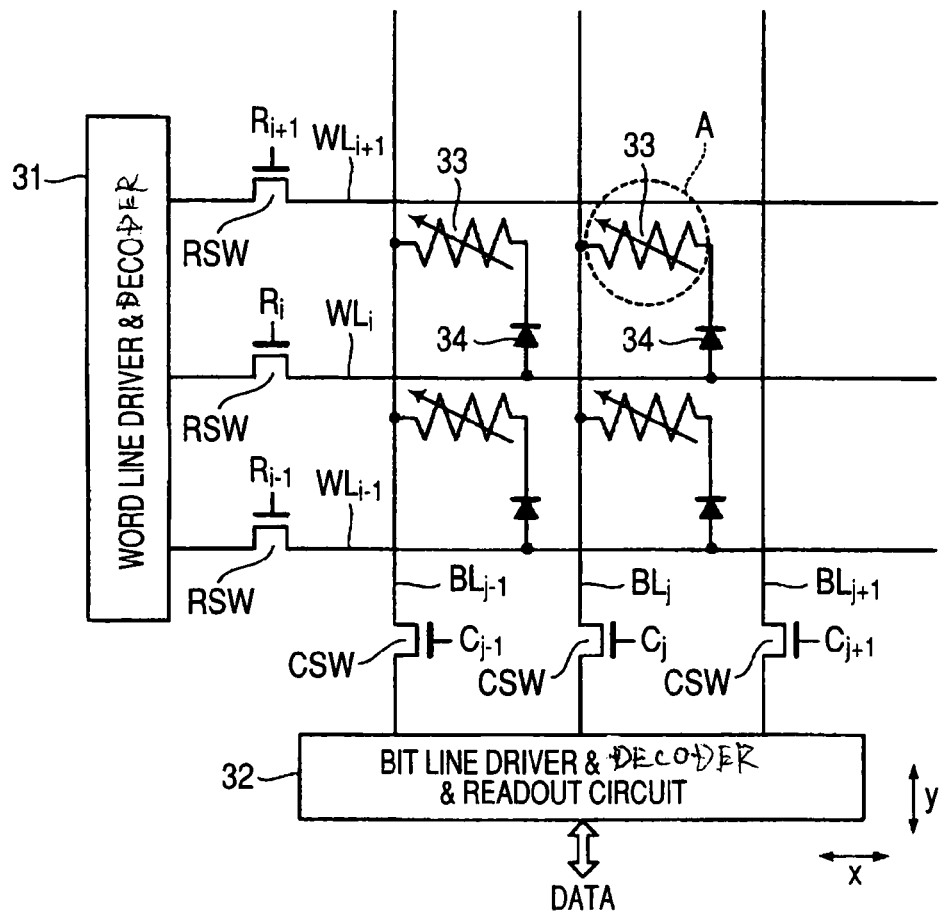
FIG. 12 is a view showing a semiconductor memory according to an embodiment of the invention.

(2) Semiconductor Memory:

A. Structure:

FIG. 12 shows a cross-point type semiconductor memory according to an embodiment of the invention.

Word lines $WL_{i-1}$, $WL_i$ and $WL_{i+1}$ extend in an X direction; and bit lines $BL_{j-1}$, $BL_j$ and $BL_{j+1}$ extend in a Y direction.

One end of each of the word lines $WL_{i-1}$, $WL_i$ and $WL_{i+1}$ is connected to a word line driver & decoder 31 via a MOS transistor RSW as a selective switch; and one end of each of the bit lines $BL_{j-1}$, $BL_j$ and $BL_{j+1}$ is connected to a bit line driver & decoder & readout circuit 32 via a MOS transistor CSW as a selective switch.

Selective signals $RL_{i-1}$, $RL_i$ and $RL_{i+1}$ for selecting a single word line (row) are inputted in a gate of the MOS transistor RSW; and selective signals $CL_{i-1}$, $CL_i$ and $CL_{i+1}$ for selecting a single bit line (column) are inputted in a gate of the MOS transistor CSW.

A memory cell 33 is disposed in an intersection between each of the word lines $WL_{i-1}$, $WL_i$ and $WL_{i+1}$ and each of the bit lines $BL_{j-1}$, $BL_j$ and $BL_{j+1}$, and is of a so-called cross-point type cell array structure.

A diode 34 for preventing a sneak current at the time of recording/reproducing is added in the memory cell 33.

Figure 13:
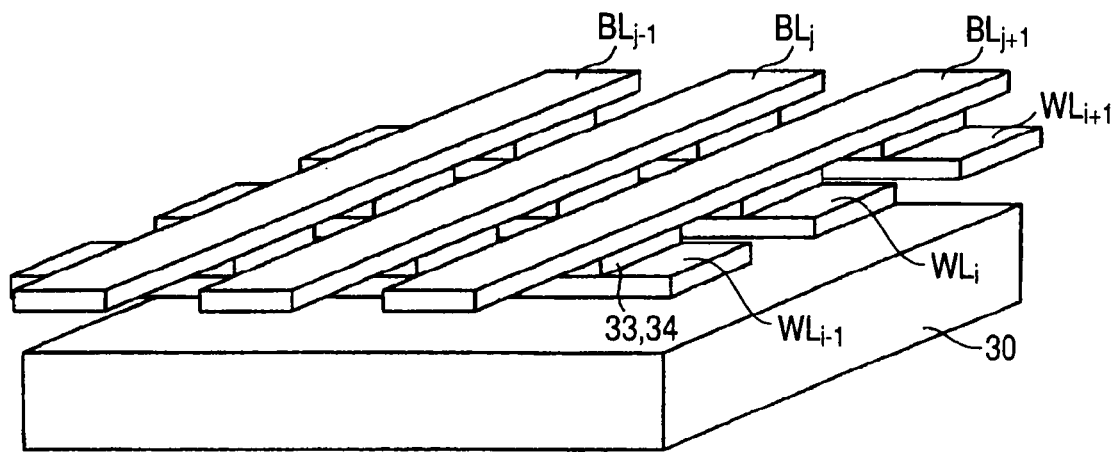
FIG. 13 is a view showing a structure of a memory cell array.

FIG. 13 shows a structure of a memory cell array part of the semiconductor memory as shown in FIG. 12.

The word lines $WL_{i-1}$, $WL_i$ and $WL_{i+2}$, and the bit lines $BL_{j-1}$, $BL_j$ and $BL_{j+1}$ are disposed on a semiconductor chip 30, and the memory cell 33 and the diode 34 are disposed in each of the intersections between these respective wirings.

Figure 15:
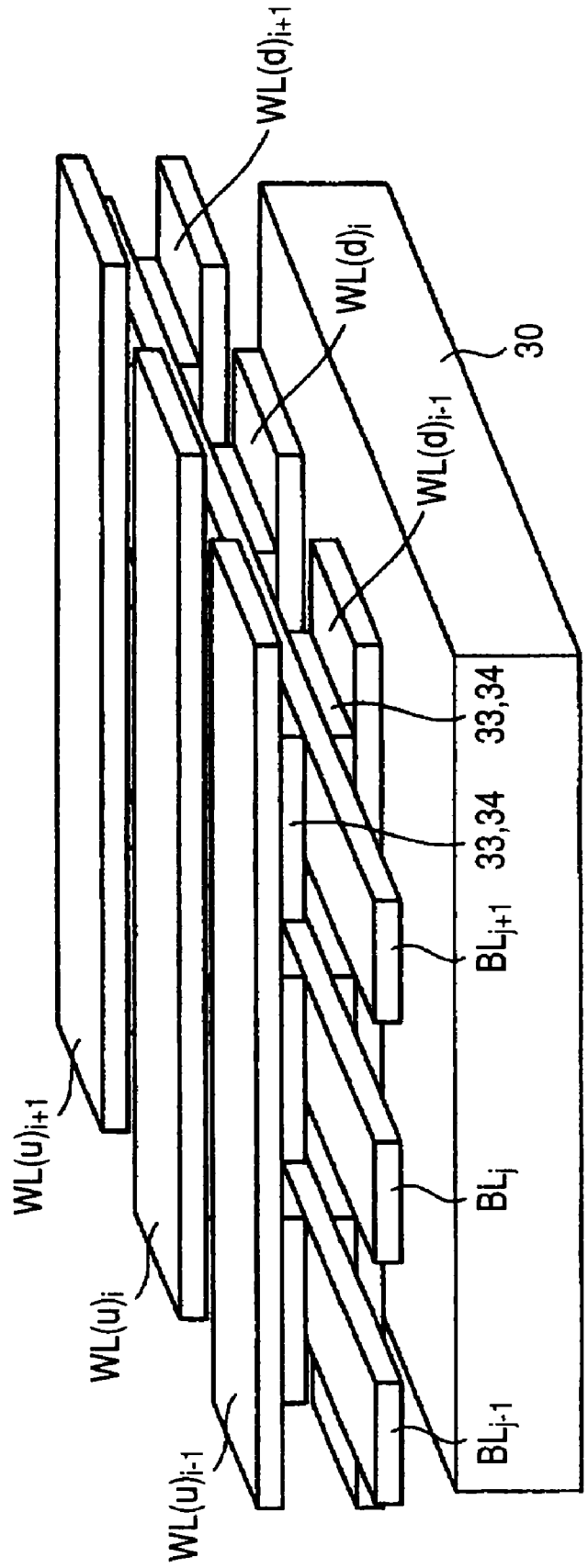
FIG. 15 is a view showing a structure of a memory cell array.
Figure 16:
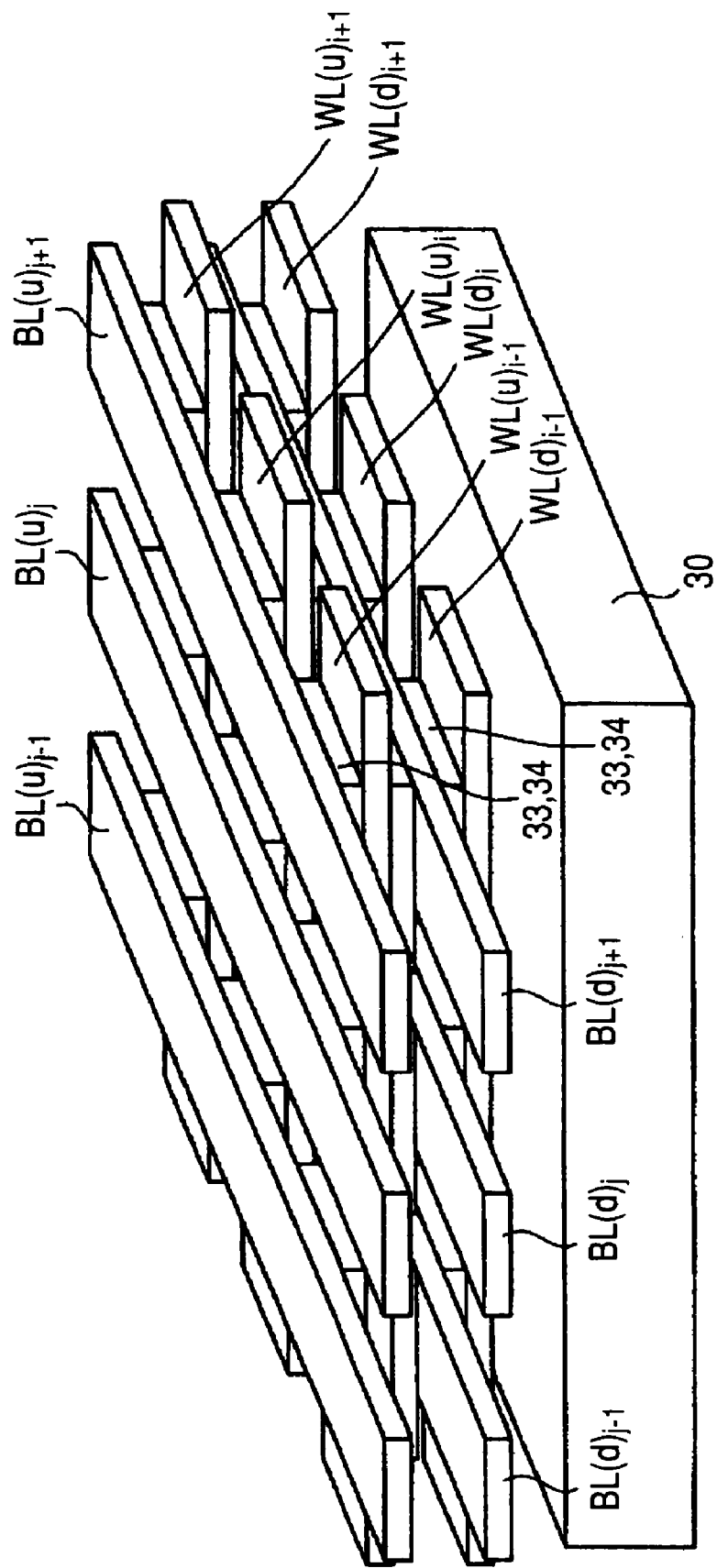
FIG. 16 is a view showing a structure of a memory cell array.

A characteristic feature of such a cross-point type cell array structure resides in an advantage for high integration because it is not necessary to connect a MOS transistor individually to the memory cell 33. For example, as shown in FIGS. 15 and 16, it is possible to make a memory cell array have a three-dimensional structure by stacking the memory cells 33.

Figure 14:
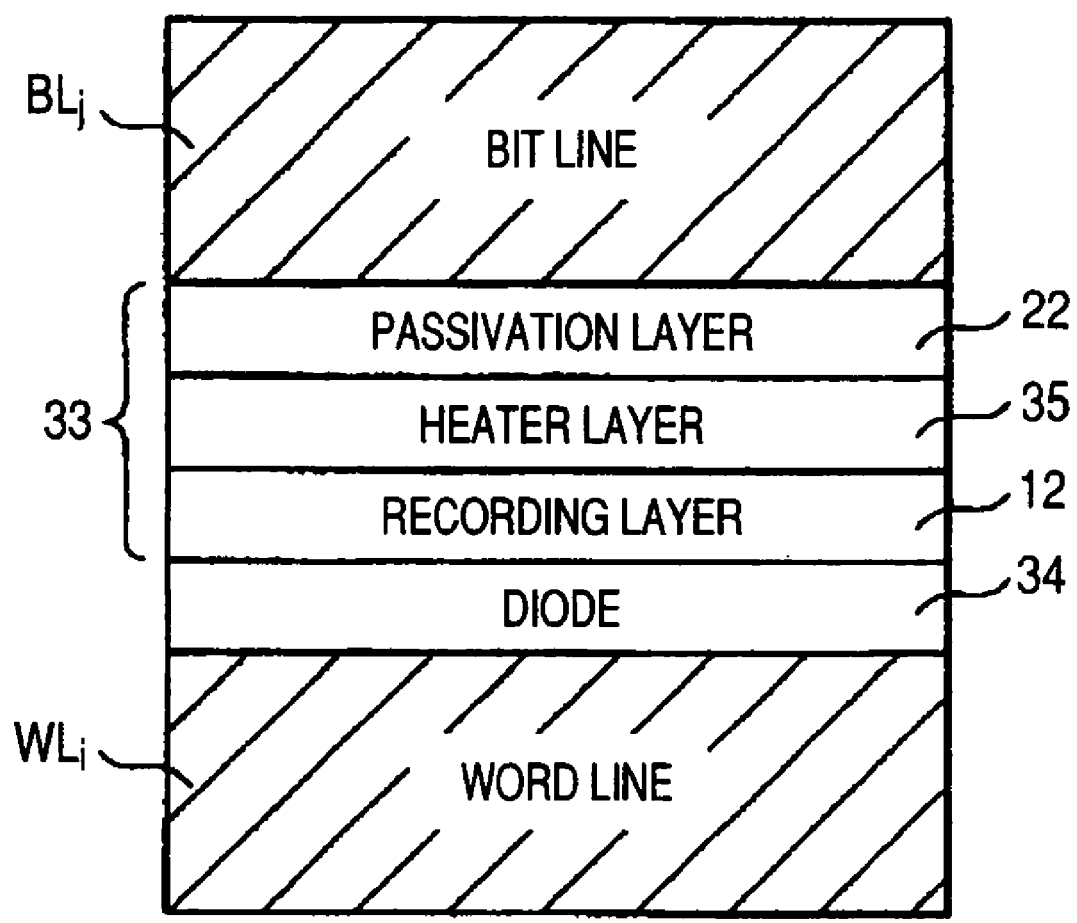
FIG. 14 is a view showing a structure of a memory cell.

The memory cell 33 is, for example, configured of a stack structure of the recording layer 12, the passivation layer 22 and a heater layer 35 as shown in FIG. 14. One bit data is stored by the single memory cell 33. Also, the diode 34 is disposed between the word line $WL_i$ and the memory cell 33.

B. Recording/Reproducing Operation:

The recording/reproducing operation is described with reference to FIGS. 12 to 14.

Here, the memory cell 33 surrounded by a dotted line A is selected, and a recording/reproducing operation is carried out with respect to this memory cell 33.

The information recording (set operation) may be performed by applying a voltage to the selected memory cell 33 to generate a potential gradient in the memory cell 33 and making a current pulse flow. Therefore, for example, a state that the potential of the word line $WL_i$ is relatively lower than the potential of the bit line $BL_j$ is prepared. A negative potential may be applied to the word line $WL_i$ by bringing the bit line $BL_j$ with a fixed potential (for example, a ground potential).

At that time, in the selected memory cell 33 as surrounded by the dotted line A, a part of the A ion moves into the side of the word line (cathode) $WL_i$, whereby the A ion in the crystal relatively decreases with respect to the O ion. Also, the A ion which has moved into the side of the word line $WL_i$ receives an electron from the word line $WL_i$ and deposits as a metal.

In the selected memory cell 33 as surrounded by the dotted line A, the O ion becomes excessive, resulting in an increase of the valence of the B ion in the crystal. That is, since the selected memory cell 33 as surrounded by the dotted line A has electron conductivity by the injection of a carrier due to a phase change, the information recording (set operation) is accomplished.

At the time of information recording, it is preferable that the non-selected word lines $WL_{i-1}$ and $WL_{i+1}$ and the non-selected bit lines $BL_{i-1}$ and $BL_{j+1}$ are all biased at the same potential.

Also, at the time of standby before the information recording, it is preferable that all of the word lines $WL_{i-1}$, $WL_i$ and $WL_{i+1}$ and all of the bit lines $BL_{j-1}$, $BL_j$ and $BL_{i+1}$ are precharged.

Also, a voltage pulse for achieving the information recording may be generated by preparing a state that the potential of the word line $WL_i$ is relatively higher than the potential of the bit line $BL_j$.

The information reproduction is performed by making a voltage pulse flow in the selected memory cell 33 as surrounded by the dotted line A and detecting a resistance value of the memory cell 33. However, it is necessary that the voltage pulse is a minute amplitude to a degree that the material constituting the memory cell 33 does not cause a change in the state.

For example, a readout current generated by the readout circuit is made to flow into the memory cell 33 as surrounded by the dotted line A from the bit line $BL_j$, and a resistance value of the memory cell 33 is measured by the readout circuit. By employing the previously described novel material, it is possible to secure a ratio in resistance between the high resistance state and the low resistance state of $10^3$ or more.

An erasing (reset) operation is performed by Joule heating the selected memory cell 33 as surrounded by the dotted line A by a large-current pulse and promoting an oxidation-reduction reaction in the memory cell 33.

C. Summary:

According to such a semiconductor memory, it is possible to realize higher recording density and lower consumption electric power than those in the current hard disks and flash memories.

4. Application to Flash Memory (1) Structure:

An embodiment of the invention can also be applied to a flash memory.

FIG. 17 shows a memory cell of a flash memory.

The memory cell of a flash memory is configured of an MIS (metal-insulator-semiconductor) transistor.

Diffusion layers 42 are formed in a surface region of a semiconductor substrate 41. A gate insulating layer 43 is formed on a channel region between the diffusion layers 42. A recording layer (RRAM: resistive RAM) 44 according to an embodiment of the invention is formed on the gate insulating layer 43. A control gate electrode 45 is formed on the recording layer 44.

The semiconductor substrate 41 may be a well region, and the semiconductor substrate 41 and the diffusion layer 42 have a reverse conduction type to each other. The control gate electrode 45 becomes a word line and is constituted of, for example, conductive polysilicon.

The recording layer 44 is configured of the material as shown in FIG. 2, FIG. 3 or FIG. 4.

(2) Basic Operation:

A basic operation is described with reference to FIG. 17.

The set (writing) operation is carried out by applying a potential V1 to the control gate electrode 45 and applying potential V2 to the semiconductor substrate 41.

Though it is necessary that a difference between the potentials V1 and V2 is sufficient in such a manner that the recording layer 44 causes a change in the state or a change in the resistance, each of the directions thereof is not particularly limited.

That is, any of V1>V2 or V1<V2 is employable.

For example, in the initial state (reset state), on the assumption that the recording layer 44 is an insulator (high resistance), the gate insulating layer 43 is considered to become substantially thick. Therefore, a threshold value of the memory cell (MIS transistor) is high.

When the potentials V1 and V2 are applied from this state to change the recording layer 44 into a conductor (low resistance), the gate insulating layer 43 is considered to become substantially thin. Therefore, a threshold value of the memory cell (MIS transistor) is low.

Though the potential V2 is herein applied to the semiconductor substrate 41, the potential V2 may be transferred from the diffusion layer 42 into the channel region of the memory cell in place of this.

The reset (erasing) operation is, carried out by applying a potential V1' to the control gate electrode 45, applying a potential V3 to one of the diffusion layers 42 and applying a potential V4 (<V3) to the other diffusion layer 42.

The potential V1' is set up at a value exceeding the threshold value of the memory cell in the set state.

At that time, the memory cell is in the "ON" state, not only an electron flows from one of the diffusion layers 42 into the other, but a hot electron is generated. This hot electron is injected into the recording layer 44 via the gate insulating layer 43, and therefore, the temperature of the recording layer 44 increases.

According to this, the recording layer 44 changes from the conductor (low resistance) to the insulator (high resistance). Therefore, the gate insulating layer 43 is considered to become substantially thick, and a threshold value of the memory cell (MIS transistor) is high.

In such a way, since the threshold value of the memory cell can be changed due to a principle similar to that in a flash memory, the information recording and reproducing apparatus according to an embodiment of the invention can be put to practical use by utilizing a technology of the flash memory.

Figure 18:
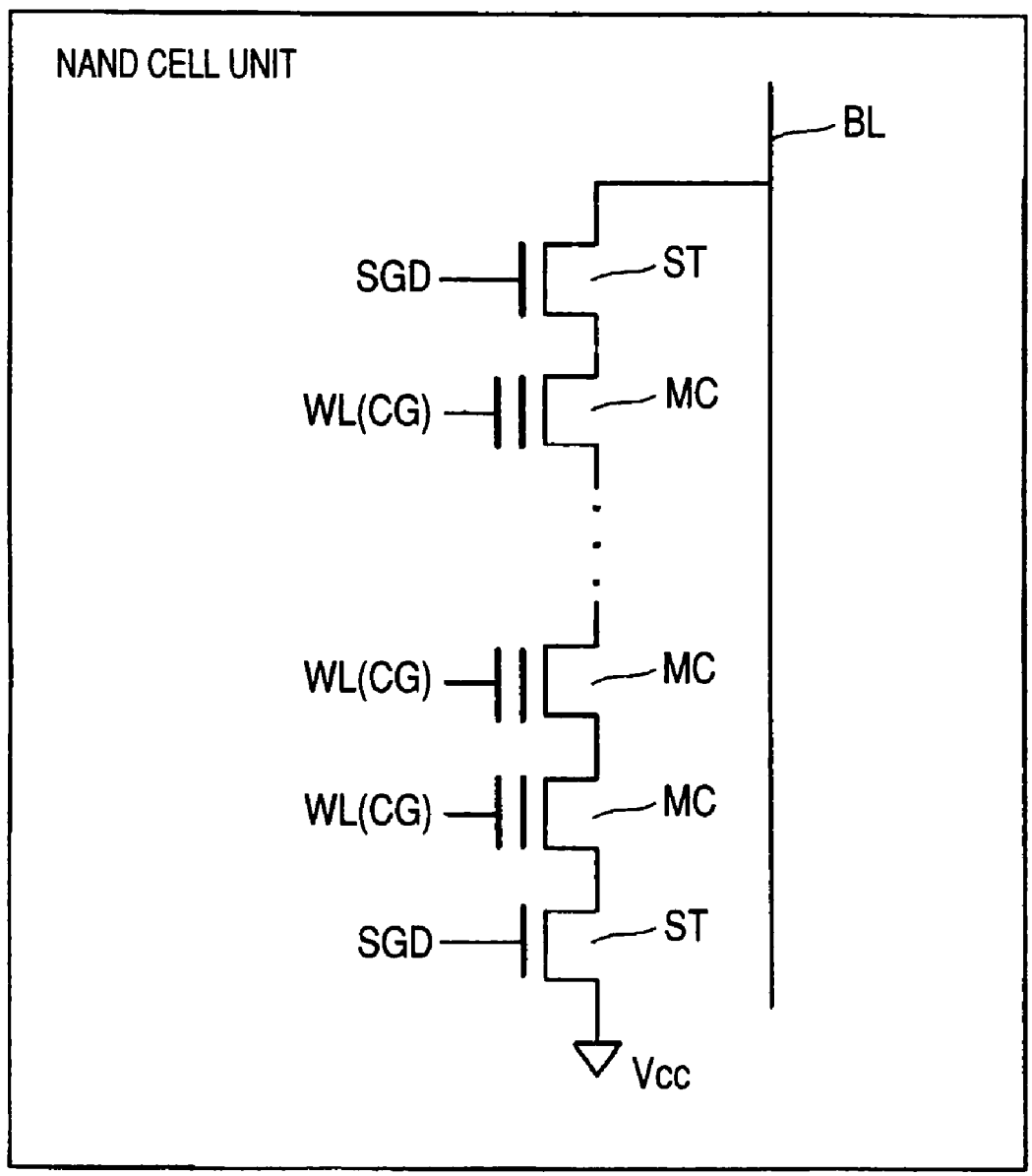
FIG. 18 is a circuit diagram showing an NAND cell unit.
Figure 19:
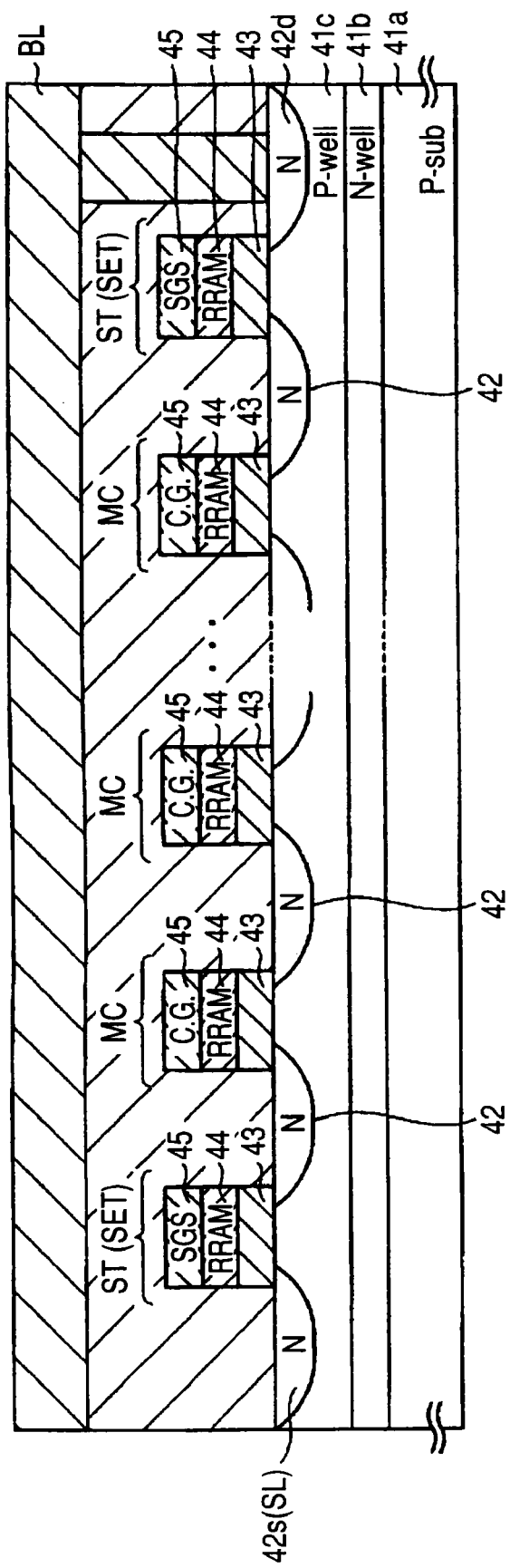
FIG. 19 is a view showing a structure of an NAND cell unit.

(3) NAND Type Flash Memory:

FIG. 18 shows a circuit diagram showing an NAND cell unit. FIG. 19 is a view showing a structure of a NAND cell unit according to an embodiment of the invention.

An N type well region 41b and a P type well region 41c are formed in a P type semiconductor substrate 41a. An NAND cell unit according to an embodiment of the invention is formed in the P type well region 41c.

The NAND cell unit is configured of an NAND string composed of plural memory cells MC connected in series and two select gate transistors ST in total, each of which is connected to the both ends of the NAND string.

The memory cell MC and the select gate transistor ST have the same structure. Specifically, they are configured of the N type diffusion layers 42, the gate insulating layer 43 on the channel region between the N type diffusion layers 42, the recording layer (RRAM) 44 on the gate insulating layer 43 and the control gate electrode 45 on the recording layer 44.

The state (insulator/conductor) of the recording layer 44 of the memory cell MC can be changed by the foregoing basic operation. On the other hand, the recording layer 44 of the select gate transistor ST is fixed in the set state, namely the conductor (low resistance).

One of the select gate transistors ST is connected to a source line SL, with the other being connected to a bit line BL.

All of the memory cells in the NAND cell unit before the set (writing) operation are in the reset state (high resistance).

The set (writing) operation is successively performed one by one from the memory cell MC on the side of the source line SL towards the memory cell on the side of the bit line BL.

V1 (plus potential) is applied as a writing potential to the selected word line (control gate electrode) WL, and $V_{pass}$ is applied as a transfer potential (a potential for turning the memory cell MC in the "ON" state) to the non-selected word line WL.

By turning the select gate transistor ST on the side of the source line SL in the "OFF" state and turning the select gate transistor ST on the side of the bit line EL in the "ON" state, a program data is transferred from the bit line BL into the channel region of the selected memory cell MC.

For example, when the program data is "1", a write inhibit potential (for example, a potential of the same degree as V1) is transferred into the channel region of the selected memory cell MC in such a manner that the resistance value of the recording layer 44 of the selected memory cell MC is not changed from the high state into the low state.

Also, when the program data is "0", V2 (<V1) is transferred into the channel region of the selected memory cell MC in such a manner that the resistance value of the recording layer 44 of the selected memory changed from the high state into the low state.

In the reset (erasing) operation, for example, V1' is applied to all of the word lines (control gate electrodes) WL, and all of the memory cells MC in the NAND cell unit are turned in the "ON" state. Also, the two select gate transistors ST are turned in the "ON" state, V3 is applied to the bit line BL, and V4 (V3) is applied to the source line SL.

At that time, since a hot electron is injected into the recording layers 44 of all of the memory cells MC in the NAND cell unit, the reset operation is carried out collectively in all of the memory cells MC in the NAND cell unit.

In the readout operation, a readout potential (plus potential) is applied to the selected word line (control gate electrode) WL, and a potential is applied to the non-selected word line (control gate electrode) WL, in such a manner that the memory cell MC is always in the "ON" regardless of whether the data is "0" or "1".

Also, the two select gate transistors ST are turned in the "ON" state, and a readout current is supplied to the NAND string when a readout potential is applied, the selected memory cell MC is turned in the "ON" or "OFF" state corresponding to a value of the stored data. Therefore, for example, the data can be read out by detecting a change of the readout current.

Figure 20:
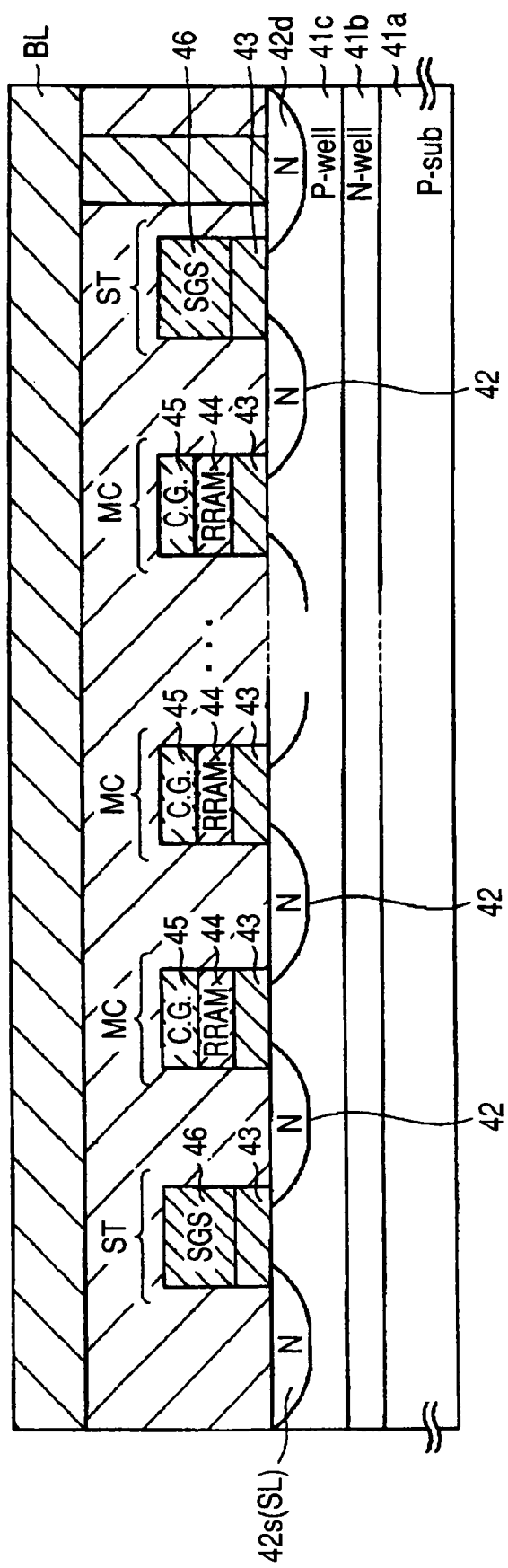
FIG. 20 is a view showing a structure of an NAND cell unit.

In the structure as shown in FIG. 19, the select gate transistor ST has the same structure as in the memory cell MC. However, for example, as shown in FIG. 20, it is also possible to make the select gate transistor ST as a usual MIS transistor without forming a recording layer.

Figure 21:
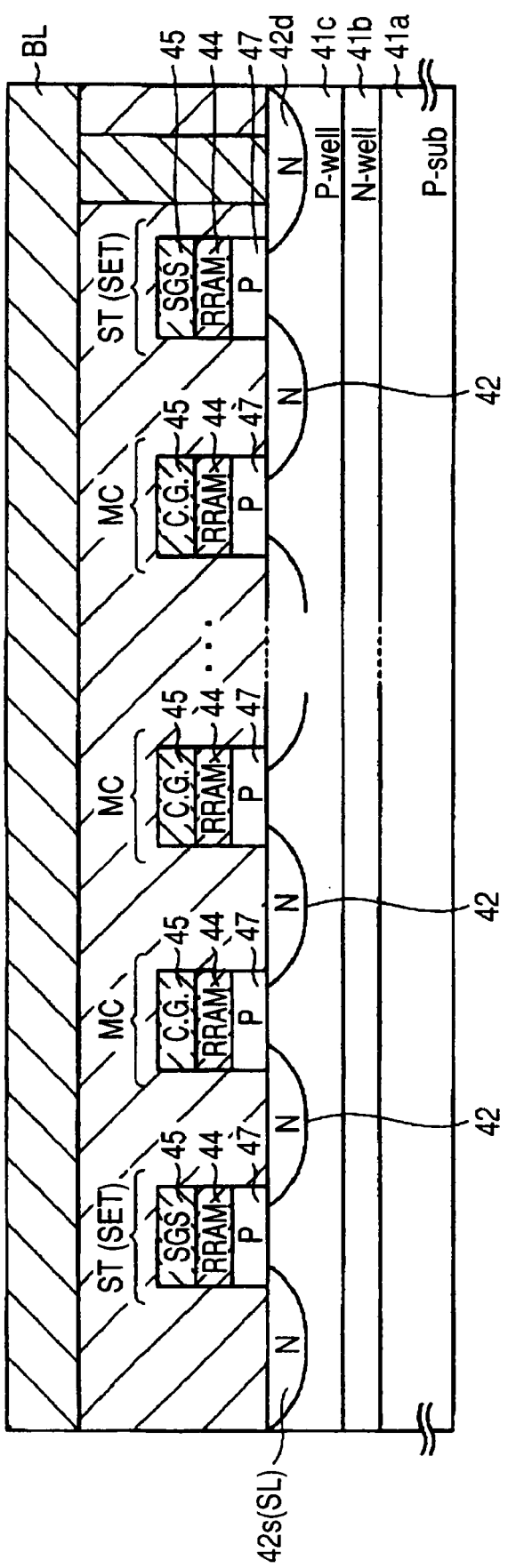
FIG. 21 is a view showing a structure of an NAND cell unit.

FIG. 21 is a modification example of one NADN type flash memory.

This modification example is characterized in that the gate insulation layers of the plural memory cells MC configuring the NAND string are replaced by a P type semiconductor layer 47.

When high integration advances, and the memory cell MC becomes minute, the P type semiconductor layer 47 is filled with a depletion layer in a state that no voltage is applied.

At the time of setting (writing), a plus writing potential (for example, 3.5 V) is applied to the control gate electrode 45 of the selected memory cell MC, and a plus transfer potential (for example, 1 V) is applied to the control gate electrode 45 of the non-selected memory cell MC.

At that time, the surfaces of the P type well regions 41c of the plural memory cells MC in the NAND string are reversed from a P type to an N type, whereby a channel is formed.

Then, as described previously, by turning the select gate transistor ST on the side of the bit line BL in the "ON" state and transferring a program data "0" from the bit line BL into the channel region of the selected memory cell MC, the set operation can be performed.

For example, by applying a minus erasing potential (for example, −3.5 V) to all of the control gate electrodes 45 and applying a ground potential (0 V) to the P type well regions 41c and the P type semiconductor layers 47, the reset (erasing) operation can be carried out collectively in all of the memory cells MC configuring the NAND string.

At the time of readout, a plus readout potential (for example, 0.5 V) is applied to the control gate electrode 45 of the selected memory cell MC, and a transfer potential (for example 1 V) is applied to the control gate electrode 45 of the non-selected memory cell MC in such a manner that the memory cell MC is always in the "ON" regardless of whether the data is "0" or "1".

However, a threshold voltage Vth of the memory cell MC in the "1" state is made to fall within the range of 0 V<Vth<0.5 V; and a threshold voltage Vth of the memory cell MC in the "0" state is made to fall within the range of 0.5 V<Vth<1V.

Also, the two select gate transistors ST are turned in the "ON" state, and a readout current is supplied to the NAND string.

In such a state, the current amount of flowing in the NAND string is changed corresponding to a value of the stored data in the selected memory cell MC, and therefore, the data can be read out by detecting this change.

In this modification example, it is preferable that the holdup amount of the P type semiconductor layer 47 is larger than that of the P type well region 41c and that the Fermi level of the P type semiconductor layer 47 is deeper by about 0.5 V than that of the P type well region 41c.

This is because when a plus potential is applied to the control gate electrode 45, the reverse from a P type to an N type starts from the surface portion of the P type well region 41c between the N type diffusion layers 42, whereby a channel is formed.

According to this, for example, at the time of writing, the channel of the non-selected memory cell MC is formed only at the interface between the P type well region 41c and the P type semiconductor layer 47; and at the time of readout, the channels of the plural memory cells MC in the NAND string are formed at the interface between the P type well region 41c and the P type semiconductor layer 47.

That is, even when the recording layer 44 of the memory cell MC is a conductor (in the set state), the diffusion layer 42 and the control gate electrode 45 do not cause a short circuit.

Figure 22:
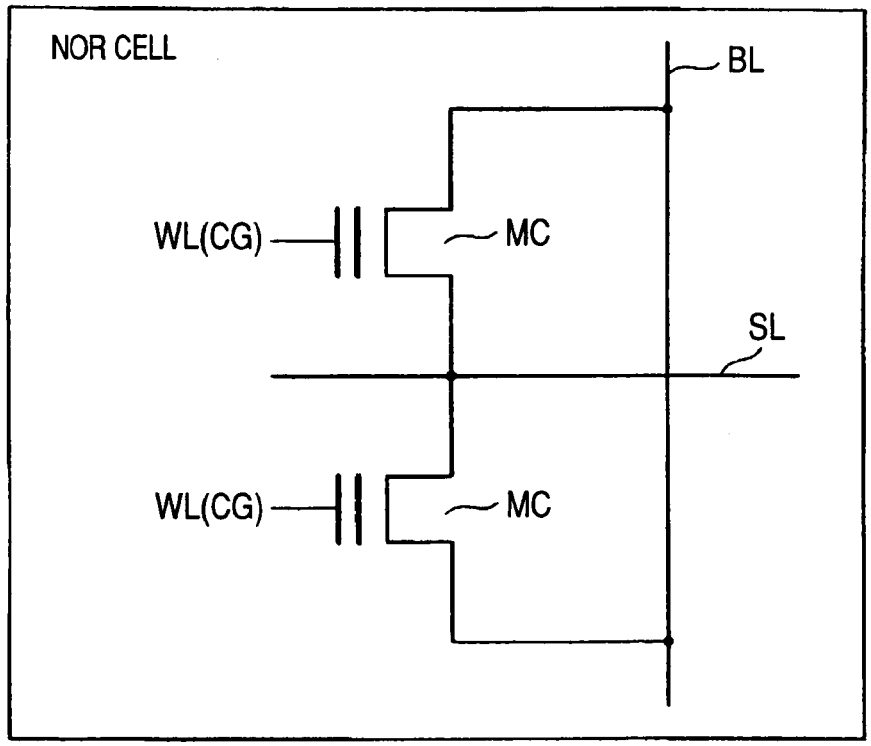
FIG. 22 is a circuit diagram showing an NOR cell unit.
Figure 23:
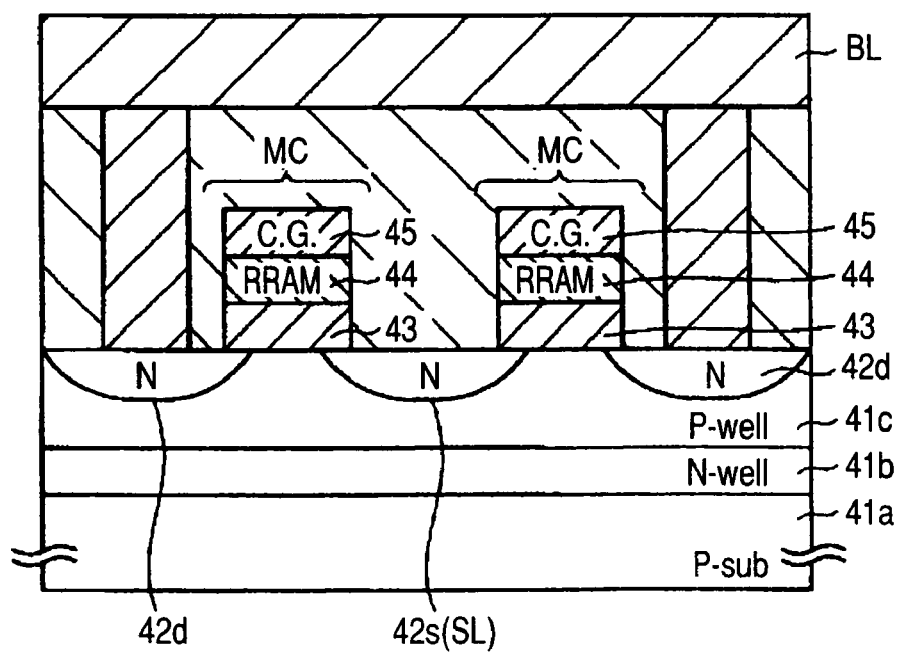
FIG. 23 is a view showing a structure of an NOR cell.

(4) NOR Type Flash Memory:

FIG. 22 shows a circuit diagram of an NOR cell unit. FIG. 23 shows a structure of an NOR cell unit according to an embodiment of the invention.

The N type well region 41b and the P type well region 41c are formed in the P type semiconductor substrate 41a. The NOR cell according to an embodiment of the invention is formed in the P type well region 41c.

The NOR cell is configured of a single memory cell (MIS transistor) MC to be connected between the bit line BL and the source line SL.

The memory cell MC is configured of the N type diffusion layers 42, the gate insulating layer 43 on the channel region between the N type diffusion layers 42, the recording layer (RRAM) 44 on the gate insulating layer 43 and the control gate electrode 45 on the recording layer 44.

The state (insulator/conductor) of the recording layer 44 of the memory cell MC can be changed by the foregoing basic operation.

Figure 24:
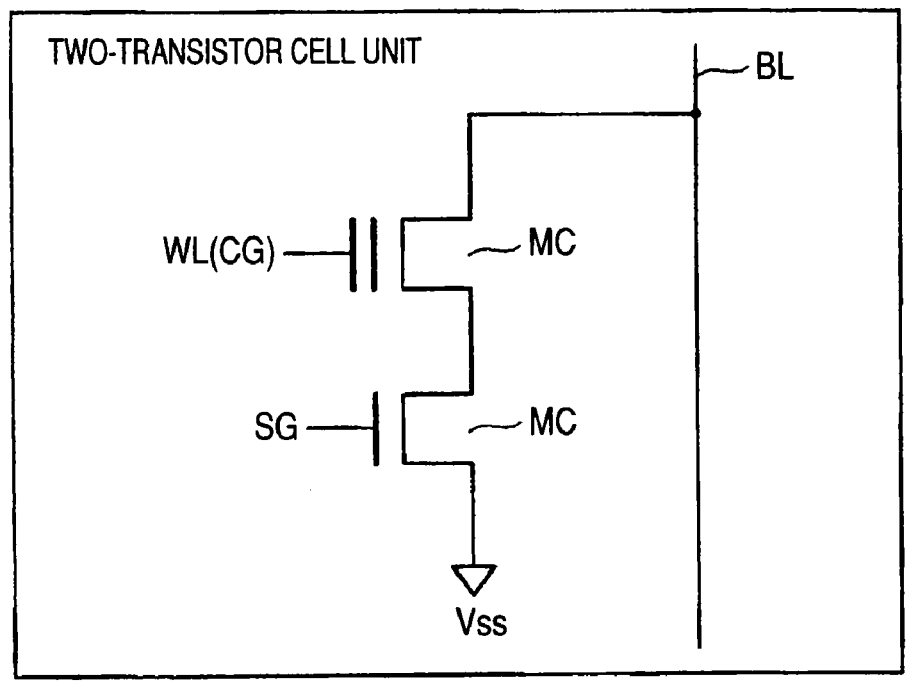
FIG. 24 is a circuit diagram showing a two-transistor cell unit.
Figure 25:
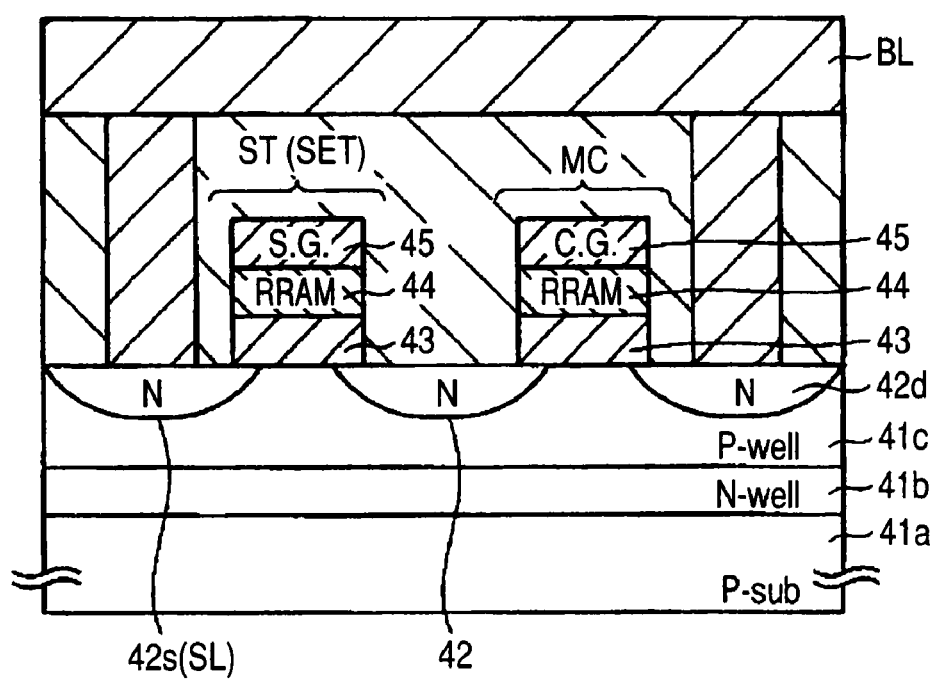
FIG. 25 is a view showing a structure of a two-transistor cell unit.

(2) Two-Transistor Flash Memory:

FIG. 24 shows a circuit diagram showing a two-transistor cell unit. FIG. 25 shows a structure of a two-transistor cell unit according to an embodiment of the invention.

A two-transistor unit has been recently developed as a new cell structure having both a characteristic feature of an NAND cell unit and a characteristic feature of an NOR cell.

The N type well region 41b and the P type well region 41c are formed in the P type semiconductor substrate 41a. The two-transistor cell unit according to an embodiment of the invention is formed in the P type well region 41c.

The two-transistor cell unit is configured of one memory cell MC and one select gate transistor ST to be connected in series.

The memory cell MC and the select gate transistor ST have the same structure. Specifically, they are configured of the N type diffusion layers 42, the gate insulating layer 43 on the channel region between the N type diffusion layers 42, the recording layer (RRAM) 44 on the gate insulating layer 43 and the control gate electrode 45 on the recording layer 44.

The state (insulator/conductor) of the recording layer 44 of the memory cell MC can be changed by the foregoing basic operation. On the other hand, the recording layer 44 of the select gate transistor ST is fixed in the set state, namely the conductor (low resistance).

The select gate transistor ST is connected to the source line SL; and the memory cell MC is connected to the bit line BL.

The state (insulator/conductor) of the recording layer 44 of the memory cell MC can be changed by the foregoing basic operation.

Figure 26:
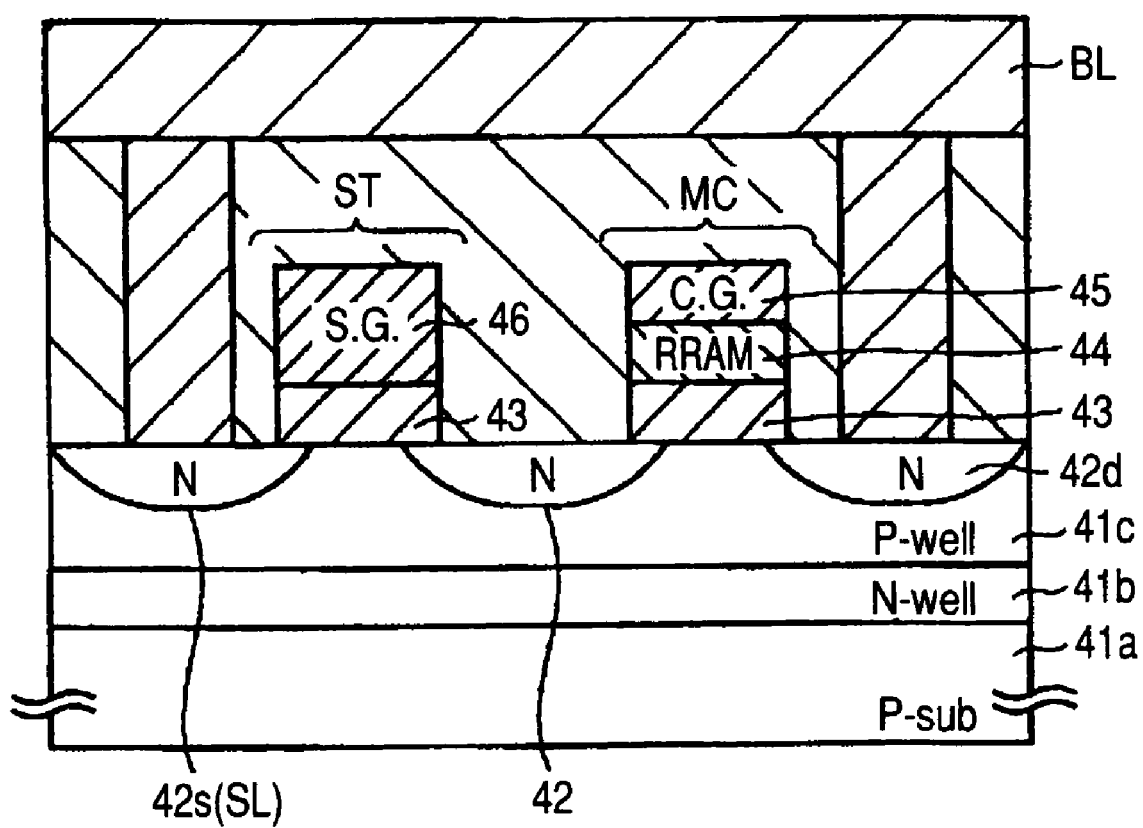
FIG. 26 is a view showing a structure of a two-transistor cell unit.

In the structure as shown in FIG. 25, the select gate transistor ST has the same structure as in the memory cell MC. However, for example, as shown in FIG. 26, it is also possible to make the select gate transistor ST as a usual MIS transistor without forming a recording layer.

5. Example

Example regarding the recording layer is described.

First of all, recording layers A and B having a hollandite structure are prepared in the sol-gel method as described below, and the presence or absence of a resistance value change due to the application of a pulse voltage is confirmed.

[Preparation of Layer A]

Tetrabutylammonium manganate obtained by a reaction of tetrabutylammonium bromide and potassium manganate in water and potassium acetate are dissolved in a molar ratio of 1/0.23 in methanol, and the solution is stirred to prepare a sol.

This sol is coated on an Si wafer having a 100 nm-thick Pt electrode formed on a surface thereof, allowed to stand in air for one hour and then heated in air at 450° C. for 2 hours.

Furthermore, it was confirmed from an X-ray diffraction pattern of a layer obtained by washing with water and drying that this layer has a $K_xMn_8O_{16}$ hollandite structure.

A circular Pt electrode (upper electrode) having a diameter of about 50 μm and a thickness of about 100 nm was formed on a surface of this layer by means of sputtering, thereby preparing a recording device.

[Preparation of Recording Layer B]

Fumaric acid is added to a potassium manganate aqueous solution such that a molar ratio of potassium manganate to fumaric acid is 3/1, and the mixture is stirred to obtain a sol. This sol is coated on an Si wafer having a 100 nm-thick Pt electrode formed on a surface thereof, allowed to stand in air for one hour, washed with water, heated in air at 110° C. for 12 hours and then heated in air at 450° C. for 2 hours.

Furthermore, it was confirmed from an X-ray diffraction pattern of a layer obtained by treating with an acid, washing with water and drying that this layer has an $\alpha$-$MnO_2$ hollandite structure.

A circular Cu electrode (upper electrode) having a diameter of about 50 pm and a thickness of about 100 nm was formed on a surface of this layer by means of sputtering at a substrate temperature of about 400° C., thereby preparing a recording device.

It was confirmed by XPS depth profile analysis of a recording device formed in the same manner that Cu is diffused in the $\alpha$-$MnO_2$ layer, namely, the recording layer has a $Cu_xMn_8O_{16}$ hollandite structure.

[Confirmation of Change in Resistance by Application of Voltage]

As to the recording layer A, in the case where a Pt lower electrode was grounded, and a positive voltage pulse (voltage; 10 V, width; 1 μsec) was applied to the—Pt upper electrode, a change in resistance of the layer was measured. As a result, the resistance value of the recording layer A after the application of a voltage pulse was lower than that before the application of a voltage pulse.

As to the recording layer B, a Pt lower electrode was grounded, and a positive voltage pulse (voltage; 10 V, width: 10 μsec) was applied to the Cu upper electrode. As a result, the resistance value of the recording layer 5 after the application of a positive voltage pulse was higher than that before the application of a positive voltage pulse.

Furthermore, a Pt lower electrode was grounded, and a negative voltage pulse (voltage; −10 V, width: 1 μsec) was applied to the Cu upper electrode. As a result, the resistance value of the recording layer B after the application of a negative voltage pulse was lower than that just before the application of a negative voltage pulse.

6. Others

According to an embodiment of the invention, since the information recording (writing) is carried out only in a site (recording unit) to which an electric field is applied, it is possible to record the information in an extremely minute region at an extremely low power consumption.

The erasing is carried out by applying heat. At that time, by using a material proposed in an embodiment of the invention, a structural change of an oxide is not substantially generated, and therefore, it is possible to achieve the erasing at a low power consumption.

Also, besides the application of heat, the erasing can be carried out by applying an electric field in a reverse direction to that at the time of recording. In that case, since an energy loss namely as heat diffusion is low, the erasing can be achieved at a lower consumption electric power.

In the light of the above, according to an embodiment of the invention, nevertheless an extremely simple construction, the information recording can be achieved in a recording density to an extent that the related-art technologies cannot reach. Accordingly, an embodiment of the invention brings great merits in industry as a next-generation technology capable of defeating the wall of the recording density of the current nonvolatile memories.

An embodiment of the invention is never limited to the foregoing embodiments, and the respective configuration factors can be modified and embodied within the scope from which the gist of the invention does not deviate. Also, various inventions can be constituted by adequately combining the plural configuration factors disclosed in the foregoing embodiment. For example, some configuration factors may be deleted from all the configuration factors disclosed in the foregoing embodiment or configuration factors of a different embodiment may be adequately combined.

The disclosures of the priority documents, Japanese Patent Application No. P2007-155703, filed Jun. 12, 2007, and Japanese Patent Application No. P2007-94629, filed Mar. 30, 2007, are incorporated by reference herein in their entireties.

The invention claimed is:

1. An information recording and reproducing apparatus comprising a recording part comprising
   a first electrode;
   a recording layer on the first electrode; and
   at least one of a second electrode and a passivation layer on the recording layer,
   wherein the recording layer comprises at least a first compound having a hollandite structure represented by the formula (1):

$A_xB_yO_{16}$, wherein
   $0 \leq x \leq 2.0$,
   $7.0 \leq y \leq 9.0$, and
   B is at least one element selected from the group consisting of the elements of Group 4 (Group IVA) to Group 11 (Group IB).

2. The apparatus according to claim 1, wherein B is at least one element selected from the group consisting of Mn, Ti, V, Cr, Zr, Nb, Mo, Ru, Rh, Pd, Hf, Ta, W, Re, Os and Ir.

3. The apparatus according to claim 1, wherein B is at least one element selected from the group consisting of Mn, Ti, V, Cr and Mo.

4. The apparatus according to claim 1, wherein B is Mn.

5. The apparatus according to claim 1, wherein A is at least one element selected from the group consisting of alkali metal elements (Group 1), alkaline earth metal elements (Group 2), rare earth elements (Group 3), transition elements of Group 4 to Group 11, Group 12 elements, Group 13 elements, Group 14 elements and Group 15 elements.

6. The apparatus according to claim 1, wherein A is at least one element selected from the group consisting of Na, K, Rb, Cs, Mg, Ca, Sr, Ba, La, Pr, Nd, Sc, Y, V, Cr, Mn, Fe, Co, Ni, Cu, Zn, Cd, Hg, Ag, Tl, Pb and Bi.

7. The apparatus according to claim 1, wherein A is at least one element selected from the group consisting of Na, K, Rb, Cs and Ag.

8. The apparatus according to claim 1, wherein A is at least one element selected from the group consisting of Fe, Co, Ni, Cu and Zn.

9. The apparatus according to claim 1, wherein A is at least one element selected from the group consisting of La, Pr, Nd, Sc, Y, Al, Tl and Bi.

10. The apparatus according to claim 1, wherein the first compound comprises at least one crystal having a c-axis perpendicular to the first electrode.

11. The apparatus according to claim 1, wherein the recording part further comprises in contact with the first compound a metal or alloy layer including A.

12. The apparatus according to claim 1, wherein the recording part further comprises in contact with the first compound a second compound including a vacant site capable of accommodating A.

13. The apparatus according to claim 12, wherein
the second compound has a hollandite structure;
the second compound comprises a different group of elements than the first compound; and
the second compound is represented by the formula (2):

$C_zD_wO_{16}$, wherein
$0 \leq z \leq 2.0$;
$7.0 \leq w \leq 9.0$;
C is at least one element selected from the group consisting of alkali metal elements (Group 1), alkaline earth metal elements (Group 2), rare earth elements (Group 3), transition elements of Group 4 to Group 11, Group 12 elements, Group 13 elements, Group 14 elements and Group 15 elements; and
D is at least one element selected from the group consisting of transition elements of Group 4 (Group IVA) to Group 11 (Group IB).

14. The apparatus according to claim 12, wherein the second compound is epitaxially grown on the first compound.

15. The apparatus according to claim 12, wherein the second compound comprises at least one selected from the group consisting of compounds represented by:

$\square_xMZ_2$, wherein $\square$ represents a vacant site in which A is accommodated; M is at least one element selected from the group consisting of Ti, V, Cr, Mn, Fe, Co, Ni, Nb, Ta, Mo, W, Re, Ru and Rh; Z is at least one element selected from the group consisting of 0, S, Se, N, Cl, Br and I; and $0.3 \leq x \leq 1$, $\square_xMZ_3$, wherein $\square$ represents a vacant site in which A is accommodated; M is at least one element selected from the group consisting of Ti, V, Cr, Mn, Fe, Co, Ni, Nb, Ta, Mo, W, Re, Ru and Rh; Z is at least one element selected from the group consisting of 0, S, Se, N, Cl, Br and I; and $1 \leq x \leq 2$, $\square_xMZ_4$, wherein $\square$ represents a vacant site in which A is accommodated; M is at least one element selected from the group consisting of Ti, V, Cr, Mn, Fe, Co, Ni, Nb, Ta, Mo, W, Re, Ru and Rh; Z is at least one element selected from the group consisting of 0, S, Se, N, Cl, Br and I; and $1 \leq x \leq 5\ 2$, and $\square_xMPO_z$, wherein □ represents a vacant site in which A is accommodated; M is at least one element selected from the group consisting of Ti, V, Cr, Mn, Fe, Co, Ni, Nb, Ta, Mo, W, Re, Ru and Rh; $0.3 \leq x \leq 3$; and $4 \leq z \leq 6$.

16. The apparatus according to claim 15, wherein the second compound has a structure selected form the group consisting of a ramsdelite structure, an anatase structure, a brookite structure, a pyrolusite structure, an $ReO_3$ structure, an $MoO_{1.5}PO_4$ structure, a $TiO_{0.5}PO_4$ structure, an $FePO_4$ structure, a $\beta$-$MnO_2$ structure, a $\gamma$-$MnO_2$ structure and a $\lambda$-$MnO_2$ structure.

17. The apparatus according to claim 1, wherein the recording part comprises
the first electrode,
the recording layer on the first electrode, and
the passivation layer on the recording layer;
wherein the recording layer comprises at least one recording unit produced by applying a voltage to the recording layer to generate a state change in the recording layer; and
the apparatus further comprises a probe for locally applying voltage to the at least one recording unit.

18. The apparatus according to claim 1, wherein
the apparatus further comprises at least one word line and at least one bit line; and
the recording layer is between the at least one word line and the at least one bit line.

19. The apparatus according to claim 1, wherein
the first electrode comprises a semiconductor substrate;
the recording part further comprises a gate insulating layer on the semiconductor substrate;
the recording layer is on the gate insulating layer;
the second electrode is on the recording layer; and
the semiconductor substrate, the gate insulating layer, the recording layer and the second electrode are part of a MIS transistor.

20. The apparatus according to claim 1, wherein
the first electrode comprises a first conductive semiconductor substrate including two second conductive diffusion layers;
the recording part further comprises a first conductive semiconductor layer on the first conductive semiconductor substrate between the two second conductive diffusion layers;
the recording layer is on the first conductive semiconductor layer; and
the second electrode is on the recording layer and controls conduction/non-conduction between the two second conductive diffusion layers.

* * * * *